(12) United States Patent  (10) Patent No.: US 7,851,332 B2
Yamazaki et al.  (45) Date of Patent: Dec. 14, 2010

(54) SEMICONDUCTOR DEVICE AND METHOD FOR MANUFACTURING THE SAME

(75) Inventors: Shunpei Yamazaki, Setagaya (JP); Junichi Koezuka, Atsugi (JP); Tetsuya Kakehata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 199 days.

(21) Appl. No.: 12/237,606

(22) Filed: Sep. 25, 2008

(65) Prior Publication Data

US 2009/0096054 A1 Apr. 16, 2009

(30) Foreign Application Priority Data

Oct. 10, 2007 (JP) ............................. 2007-264719

(51) Int. Cl.
    *H01L 21/00* (2006.01)
(52) U.S. Cl. ................. 438/463; 257/E21.568
(58) Field of Classification Search ............ 438/463, 438/473, 455, 458, 459; 257/E21.599, E21.568
    See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,303,405 B1 * | 10/2001 | Yoshida et al. | ............. 438/46 |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,818,529 B2 | 11/2004 | Bachrach et al. | |
| 6,875,633 B2 | 4/2005 | Fukunaga | |
| RE39,484 E | 2/2007 | Bruel | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,488,667 B2 * | 2/2009 | Takeuchi et al. | ............. 438/455 |
| 2004/0104424 A1 | 6/2004 | Yamazaki | |
| 2004/0169786 A1 | 9/2004 | Yamazaki et al. | |
| 2005/0009252 A1 | 1/2005 | Yamazaki et al. | |
| 2006/0292879 A1 * | 12/2006 | Takayama et al. | ............. 438/694 |

(Continued)

FOREIGN PATENT DOCUMENTS

JP           05-211128           8/1993

(Continued)

*Primary Examiner*—Thao Le
(74) *Attorney, Agent, or Firm*—Eric J. Robinson; Robinson Intellectual Property Law Office, P.C.

(57) ABSTRACT

A semiconductor device including a semiconductor substrate is provided. The semiconductor substrate includes a substrate having an insulating surface, and a plurality of stacks over the substrate having an insulating surface. Each of the plurality of stacks includes a bonding layer over the substrate having an insulating surface, an insulating layer over the bonding layer, and a single crystal semiconductor layer over the insulating layer. The substrate having an insulating surface has a depression, and the depression is provided between one of the plurality of stacks and another adjacent one of the plurality of stacks.

12 Claims, 23 Drawing Sheets

U.S. PATENT DOCUMENTS

| | | | |
|---|---|---|---|
| 2007/0004082 A1* | 1/2007 | Tsurume et al. | 438/106 |
| 2007/0108510 A1 | 5/2007 | Fukunaga | |
| 2007/0170859 A1* | 7/2007 | Choi et al. | 313/512 |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |
| 2008/0081400 A1* | 4/2008 | Doi et al. | 438/118 |
| 2008/0096366 A1 | 4/2008 | Aoki et al. | |
| 2008/0268137 A1* | 10/2008 | Ikeda et al. | 427/70 |
| 2009/0174037 A1* | 7/2009 | Choi | 257/618 |
| 2010/0015782 A1* | 1/2010 | Yu et al. | 438/463 |

FOREIGN PATENT DOCUMENTS

| | | |
|---|---|---|
| JP | 11-163363 | 6/1999 |
| JP | 2003-257804 | 9/2003 |
| JP | 2005-539259 | 12/2005 |

* cited by examiner

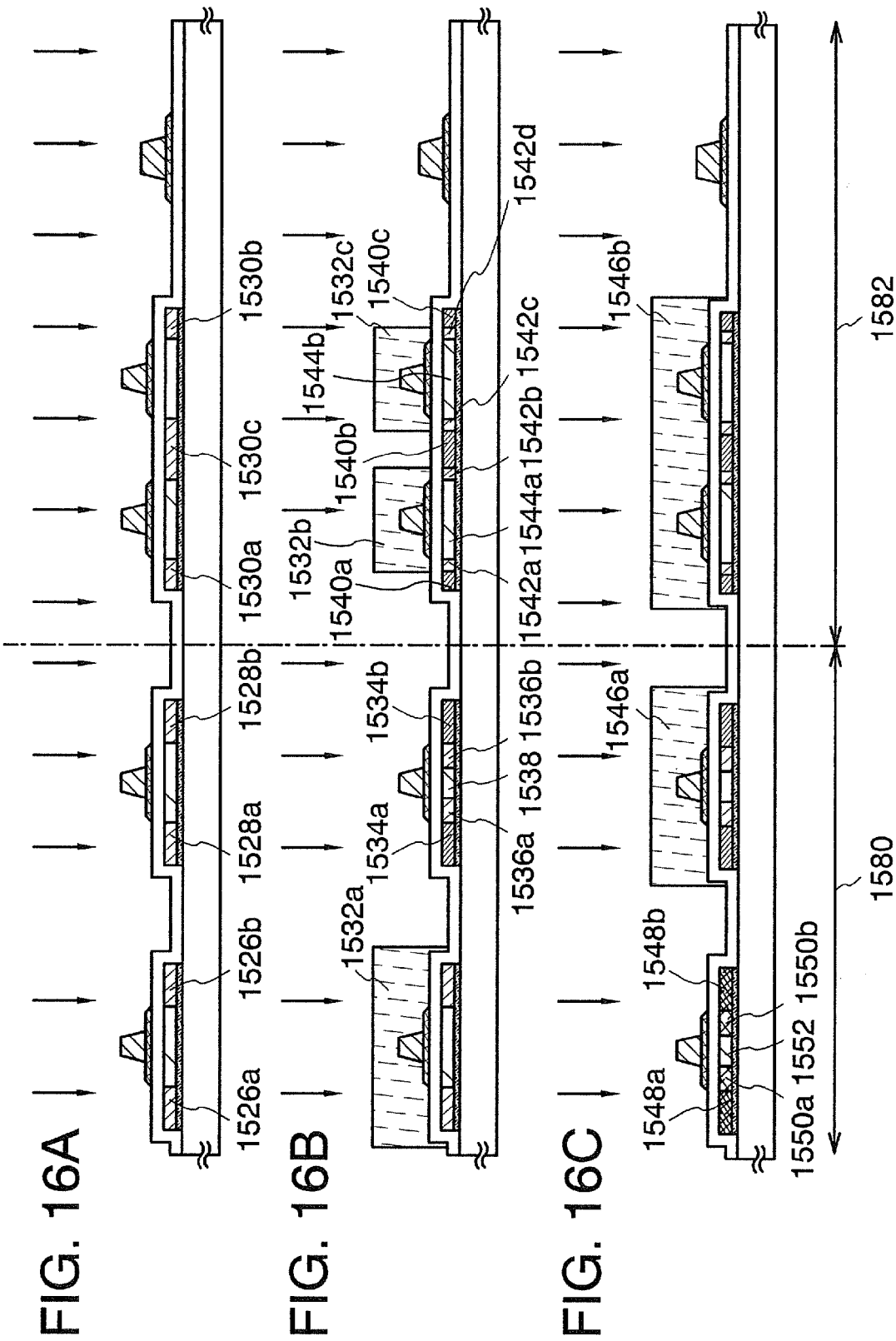

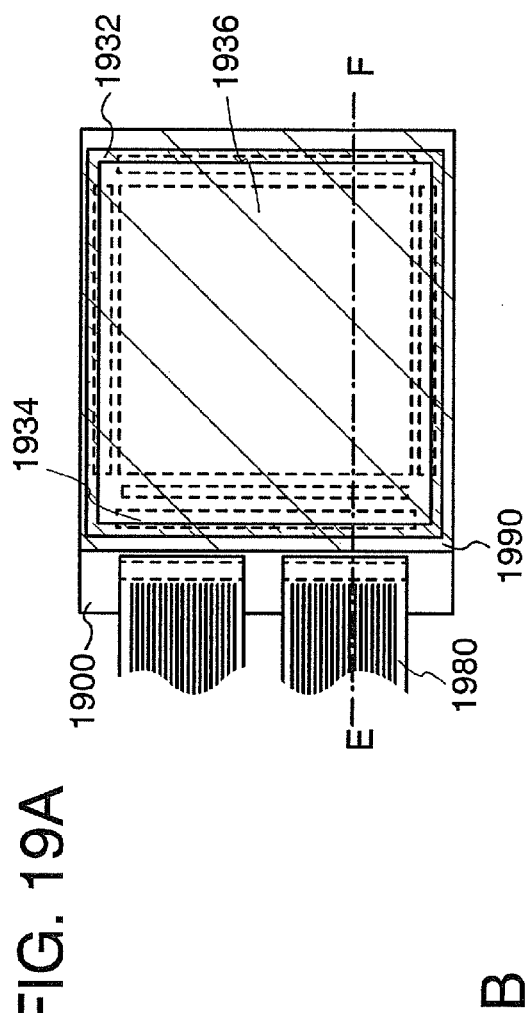
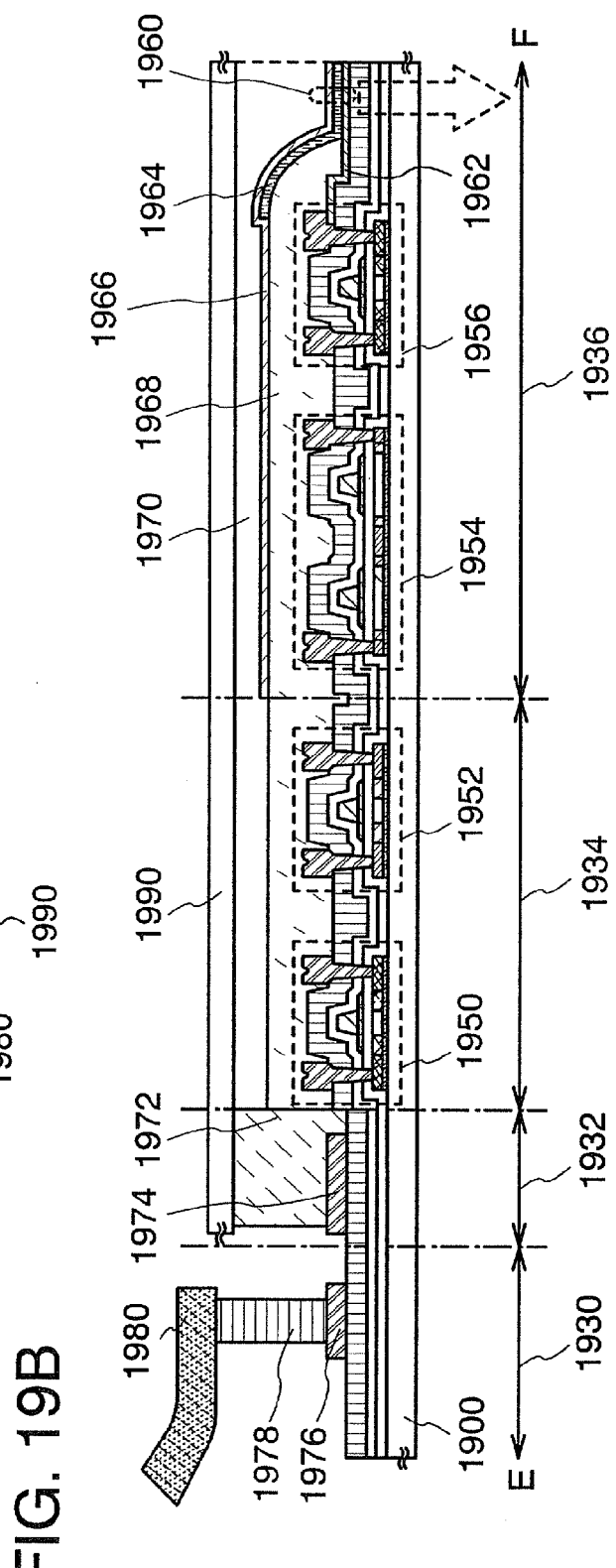
FIG. 19A
FIG. 19B

SEMICONDUCTOR DEVICE AND METHOD FOR MANUFACTURING THE SAME

BACKGROUND OF THE INVENTION

1. Field of the Invention

The present invention relates to a semiconductor device having an SOI (silicon on insulator) structure and a method for manufacturing the semiconductor device. In this specification, the semiconductor device refers to any device which can function with the use of semiconductor characteristics.

2. Description of the Related Art

In recent years, LSI technology has been dramatically progressed, and an SOI structure by which speeding up and low power consumption are realized has been attracted attention. In this technology, an active region (channel formation region) of a field-effect transistor (FET), which has been conventionally formed using bulk single crystal silicon, is formed using a single crystal silicon thin film. It is known that a MOS field-effect transistor manufactured using an SOI structure has lower parasitic capacitance than that manufactured using a conventional bulk single crystal silicon substrate, and such a MOS field-effect transistor is advantageous for speeding up.

Examples of substrates having SOI structures (hereinafter, also referred to as SOI substrates) include SIMOX substrates, bonded substrates, and the like. For example, for an SOI structure of a SIMOX substrate, oxygen ions are implanted into a single crystal silicon substrate, and heat treatment at 1300° C. or higher is conducted to form a buried oxide film (BOX) layer, so that a single crystal silicon thin film is formed on the surface. In the SIMOX substrate, a single crystal silicon thin film having an even thickness can be formed with high control by precise control of oxygen ion implantation; however, there is a problem in that long time period is needed for oxygen ion implantation, thereby causing problems of time and costs. Further, there is another problem in that the single crystal silicon thin film is easily damaged in the oxygen ion implantation.

For a bonded substrate, an SOI structure is obtained in such a manner that two single crystal silicon substrates (a base substrate and a bond substrate) are bonded to each other with an oxide film interposed therebetween, and one of the single crystal silicon substrates (the bond substrate) is thinned by grinding and/or polishing on its rear side (the side which is not a surface to be bonded), so that a single crystal silicon thin film is formed. Since it is difficult to form a uniform, thin single crystal silicon thin film by grinding and/or polishing, there is proposed a technique for thinning a film which employs hydrogen ion implantation, which is so-called Smart-Cut (registered trademark) (e.g., Reference 1: Japanese Published Patent Application No. H5-211128).

SUMMARY OF THE INVENTION

However, in a conventional SOI substrate, a single crystal silicon wafer is used as a base substrate. Due to the use of a single crystal silicon wafer, it has been difficult to increase an area. In view of the foregoing problem, it is an object of the present invention to increase an area of a semiconductor substrate (an SOI substrate). It is another object of the present invention to provide an efficient method for manufacturing a semiconductor substrate. It is still another object of the present invention to improve characteristics of the above-described semiconductor substrate. It is yet another object of the present invention to provide a semiconductor device and an electronic device which uses the above-described semiconductor substrate.

In the present invention, in order to increase an area of a semiconductor substrate (an SOI substrate) and improve manufacturing efficiency of a semiconductor substrate (an SOI substrate), a semiconductor substrate is manufactured by processing a plurality of single crystal semiconductor substrates concurrently. In specific, a series of processes is performed using a tray with which a plurality of single crystal semiconductor substrates can be concurrently processed. Here, the tray is provided with depressions for holding single crystal semiconductor substrates. Further, the single crystal semiconductor layers provided for a base substrate are subjected to etching treatment or etch-back treatment, whereby damaged regions in contact with the plurality of single crystal semiconductor layers are removed, and in addition, a depression is formed in the base substrate by removing part of a surface of the base substrate in a gap between adjacent single crystal semiconductor layers.

One aspect of a semiconductor substrate of the present invention includes a substrate having an insulating surface (a base substrate), a bonding layer over the substrate having an insulating surface, an insulating layer over the bonding layer, and a single crystal semiconductor layer over the insulating layer, where, over the substrate having an insulating surface, a plurality of stacks (at least two stacks) including a bonding layer, an insulating layer, and a single crystal semiconductor layer are provided, and wherein the substrate having an insulating surface has a depression between one of the plurality of single crystal semiconductor layers and another adjacent one of the plurality of single crystal semiconductor layers.

In the above description, the bonding layer is preferably a silicon oxide film formed by a plasma enhanced CVD method. Further, the insulating layer can be an insulating layer having a multilayer structure including any of a silicon oxide film, a silicon nitride film, a silicon oxynitride film, and a silicon nitride oxide film. Furthermore, the insulating layer may have a two-layer structure including a silicon nitride film or a silicon nitride oxide film and a silicon oxynitride film, and the silicon oxynitride film may be provided in contact with the single crystal semiconductor layer.

Further, in the above-description, a distance between one of the plurality of single crystal semiconductor layers and another adjacent one of the plurality of single crystal semiconductor layers is set to be less than or equal to 0.5 mm, whereby the plurality of single crystal semiconductor layers can be regarded as a continuous (seamless) single crystal semiconductor layer.

By using the above semiconductor substrate, various semiconductor devices and electronic devices can be provided.

One aspect of a method for manufacturing a semiconductor device of the present invention includes the steps of arranging a plurality of single crystal semiconductor substrates in a first tray; forming an insulating layer over each of the plurality of single crystal semiconductor substrates; forming a damaged region in each of the plurality of single crystal semiconductor substrates by irradiating the plurality of single crystal semiconductor substrates with ions; forming a bonding layer over the insulating layer; bonding each of the single crystal semiconductor substrates to a substrate having an insulating surface by making the bonding layer on each of the plurality of single crystal semiconductor substrates arranged in a second tray in contact with the substrate having an insulating surface; forming a plurality of single crystal semiconductor layers on the substrate having an insulating surface by separating the plurality of single crystal semiconductor substrates along the damaged regions by heat treatment; and, by etching treatment or etch-back treatment which is performed on the plurality of single crystal semiconductor layers, removing the damaged regions and forming a depression in the substrate having an insulating surface by removing part of a surface of the substrate having an insulating surface in a gap between one of the plurality of single crystal semiconductor layers and another adjacent one of the plurality of single crystal semiconductor layers.

In the above description, a silicon oxide film formed by a plasma enhanced CVD method may be used as the bonding layer. Further, an insulating layer having a multilayer structure including any of a silicon oxide film, a silicon nitride film, a silicon oxynitride film, and a silicon nitride oxide film can be formed as the insulating layer. Furthermore, the insulating layer may have a two-layer structure including a silicon nitride film or a silicon nitride oxide film and a silicon oxynitride film, and the silicon oxynitride film may be provided in contact with the single crystal semiconductor layer.

Further, in the above description, a distance between one of the plurality of single crystal semiconductor layers and another adjacent one of the plurality of single crystal semiconductor layers can be set to be less than or equal to 0.5 mm.

Furthermore, in the above description, the first tray and the second tray can be formed using quartz glass or stainless steel. The first tray and the second tray may be the same or may be different from each other. Here, in the case of including a process for cleaning the tray, a tray which has not been subjected to a process for cleaning a tray can be regarded as different from a tray which has been subjected to a cleaning process.

According to the present invention, an area of a semiconductor substrate (SOI substrate) can be increased. That is, an area of a semiconductor device can be increased. Further, semiconductor substrates are manufactured with improved productivity. That is, semiconductor devices are also manufactured with improved productivity. Furthermore, by providing a base substrate with a depression, an impurity element which is present at a surface and the vicinity of the base substrate can be removed. That is, characteristics of a semiconductor substrate can be improved. Still furthermore, by providing the base substrate with the depression, bending stress applied to a region where a bond is formed can be relieved, and a single crystal semiconductor layer can be prevented from being separated from the base substrate. That is, reliability of a semiconductor device can be improved. Note that the present invention also has an advantage that an increase of cost can be suppressed because the above-described formation of the depression can be performed concurrently with etching treatment or etch-back treatment for removing damaged regions.

BRIEF DESCRIPTION OF THE DRAWINGS

In the accompanying drawings:

FIGS. 16A to 16C are diagrams showing a manufacturing process of a semiconductor device of the present invention;

FIGS. 19A and 19B are a plan view and a cross-sectional view of a semiconductor device of the present invention, respectively;

DETAILED DESCRIPTION OF THE INVENTION

Embodiment Mode

The present invention will be hereinafter described. The present invention can be implemented in various different modes, and it is easily understood by those skilled in the art that various changes and modifications of the modes and details are possible without departing from the purpose and scope of the present invention. Therefore, the present invention is not construed as being limited to the description of the Embodiment Modes and Embodiments. Further, the same portions are denoted by the same symbols through the drawings, and repetition explanation of materials, shapes, manufacturing methods, and the like is omitted.

Embodiment Mode 1

This embodiment mode describes a semiconductor substrate having a plurality of single crystal semiconductor layers over a substrate, and a method for manufacturing the semiconductor substrate.

Figure 1:
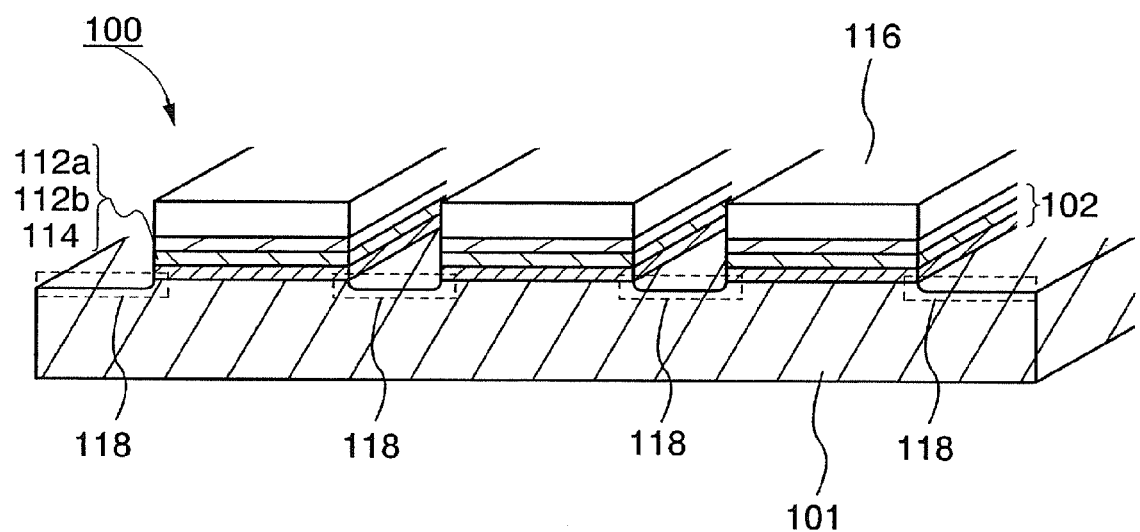
FIG. 1 is a diagram schematically showing a semiconductor substrate of the present invention.

FIG. 1 is a schematic view of a semiconductor substrate 100. The semiconductor substrate 100 has a structure in which a plurality of single crystal semiconductor layers 116 are bonded to one base substrate, which is a base substrate 101. Each of the single crystal semiconductor layers 116 is provided for the base substrate 101 with an insulating layer 102 interposed therebetween. The semiconductor substrate 100 is a so-called SOI substrate (however, a material for the single crystal semiconductor layer 116 is not limited to silicon). Note that a feature of the semiconductor substrate 100 of the present invention is that a depression 118 (also referred to as a groove) is formed in a region of the base substrate 101 without the single crystal semiconductor layers 116.

Note that FIG. 1 is a schematic view including a combination of a cross-sectional view and a perspective view in order to clarify the existence of the depression 118 which is a feature of the present invention. Therefore, FIG. 1 includes a portion which is slightly different from an actual semiconductor substrate 100. For example, FIG. 1 shows the single crystal semiconductor layers 116 for only one column in the lateral direction; however, in the actual semiconductor substrate 100, the single crystal semiconductor layers 116 are also present in the backward direction. Further, the base substrate 101 has a shape which is cut along an edge (an edge on the front side) of the single crystal semiconductor layers 116 in FIG. 1; however, actually, the base substrate 101 is not necessarily cut.

The insulating layer 102 which is formed between the base substrate 101 and the single crystal semiconductor layer 116 may have a single-layer structure or a stacked-layer structure. In this embodiment mode, the insulating layer 102 has a three-layer structure, in which a bonding layer 114, an insulating film 112b (a silicon nitride oxide layer), and an insulating film 112a (a silicon oxynitride layer) are stacked from the base substrate 101 side.

The single crystal semiconductor layer 116 is a layer formed by slicing a single crystal semiconductor substrate. As the single crystal semiconductor substrate, a commercially-available semiconductor substrate can be used. For example, a single crystal semiconductor substrate formed using an element belonging to Group 4 (an element of Group 14), such as a single crystal silicon substrate, a single crystal germanium substrate, or a single crystal silicon germanium substrate, can be used. Further, a compound semiconductor substrate using gallium arsenide, indium phosphide, or the like can be used. As described above, a material of the single crystal semiconductor layer 116 in the semiconductor substrate 100 is not limited to silicon. In this sense, the semiconductor substrate 100 is different from a general SOI substrate.

As the base substrate 101, a substrate having an insulating surface may be used. As examples of the substrate having an insulating surface, various kinds of glass substrates which are used in the electronics industry, quartz substrates, ceramics substrates, sapphire substrates, and the like are given. In terms of cost, a glass substrate is preferably used for the base substrate 101. For the glass substrate, a substrate with a coefficient of thermal expansion ranging from $25 \times 10^{-7}/°$ C. to $50 \times 10^{-7}/°$ C. (preferably $30 \times 10^{-7}/°$ C. to $40 \times 10^{-7}/°$ C.) inclusive and a strain point ranging from 580° C. to 750° C. inclusive (preferably 600° C. or higher) is used. Furthermore, in order to reduce contamination of a semiconductor device, a non-alkali glass substrate is preferably used for the glass substrate. Non-alkali glass substrates are formed from glass materials such as aluminosilicate glass, aluminoborosilicate glass, and barium borosilicate glass. Further, for the base substrate 101, conductive substrates formed from a conductor such as metal or stainless steel, semiconductor substrates formed from a semiconductor such as silicon or gallium arsenide, or the like can be used instead of substrates having an insulating surface.

As a glass substrate, mother glass which has been developed for manufacturing liquid crystal panels is preferably used. As mother glass, for example, a substrate with a size such as a 3rd generation (550 mm×650 mm), a 3.5th generation (600 mm×720 mm), a 4th generation (680 mm×880 mm or 730 mm×920 mm), a 5th generation (1100 mm×1300 mm), a 6th generation (1500 mm×1850 mm), a 7th generation (1870 mm×2200 mm), and an 8th generation (2200 mm×2400 mm) are known. By use of a large-area substrate such as mother glass for the base substrate 101, increasing an area of an SOI substrate can be realized. When increasing the area of an SOI substrate can be realized, a large-sized semiconductor device can be provided. Further, a lot of integrated circuits (also referred to as ICs, LSIs, or the like) can be manufactured at one time, and the number of semiconductor devices which are manufactured from one substrate is increased. Thus, productivity can be drastically improved.

Note that as described above, the semiconductor substrate 100 of the present invention is provided with the depression 118 in which part of a surface of the base substrate 101 is removed. By forming the depression 118, an impurity element at the surface and the vicinity of the base substrate 101 can be removed, and accordingly, contamination of the semiconductor layer can be prevented. Further, owing to the depression 118, separation of the semiconductor layer which is caused by an effect of bending stress can be prevented. Note that the depression 118 can be formed by etching treatment, etch-back treatment, or the like which is performed in order to remove a damaged region and to improve planarity. That is, a significant effect can be obtained without increasing the number of processes (without increasing cost). The details thereof are mentioned in describing a process for manufacturing the semiconductor substrate 100.

Hereinafter, a method for manufacturing the semiconductor substrate 100 shown in FIG. 1 is described with reference to FIG. 2, FIG. 3, FIG. 4, FIGS. 5A and 5B, FIGS. 6A and 6B, FIGS. 7A to 7D, FIGS. 8A and 8B, FIG. 9, and FIGS. 10A and 10B.

Figure 2:
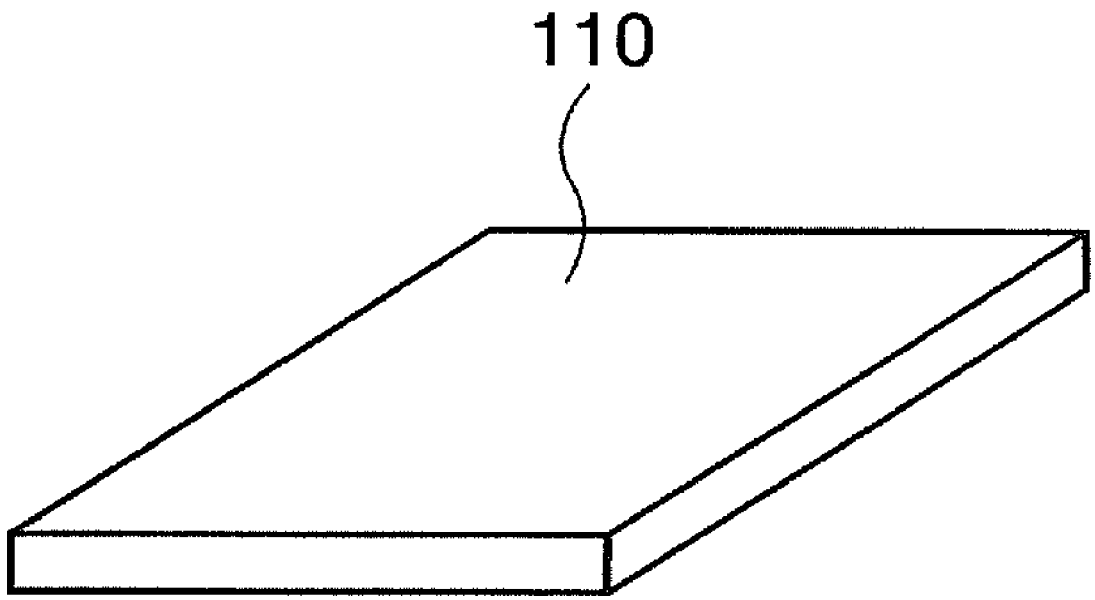
FIG. 2 is a diagram showing an example of a single crystal semiconductor substrate.

First, a single crystal semiconductor substrate 110 is prepared. The single crystal semiconductor substrate 110 is processed into a desired size and shape. FIG. 2 is an external view showing an example of a structure of the single crystal semiconductor substrate 110. In consideration of bonding to the base substrate 101 with a rectangular shape; a light exposure region of a light exposure apparatus such as a stepper which has a rectangular shape; and the like, the single crystal semiconductor substrate 110 preferably has a rectangular shape as shown in FIG. 2. For example, it is preferable, in terms of productivity, that processing be performed in such a way that a long side of the rectangular single crystal semiconductor substrate 110 is n times (n is a natural number) as large as a side of a light exposure region for one shot of a stepper. Of course, the rectangle includes a square.

The rectangular single crystal semiconductor substrate 110 can be formed by cutting a bulk single crystal semiconductor substrate which is round and commercially available. For cutting of the substrate, cutting with a dicer, a wire saw, or the like; cutting using a laser beam; cutting using plasma; cutting using an electron beam; or an optional device for cutting can be used. Further, the rectangular single crystal semiconductor substrate 100 can be manufactured in such a way that an ingot for manufacturing a semiconductor substrate, which has not been sliced into substrates, is processed into a rectangular parallelepiped shape so as to have a rectangular shape in its cross section and the ingot having a rectangular parallelepiped shape is sliced.

Figure 3:
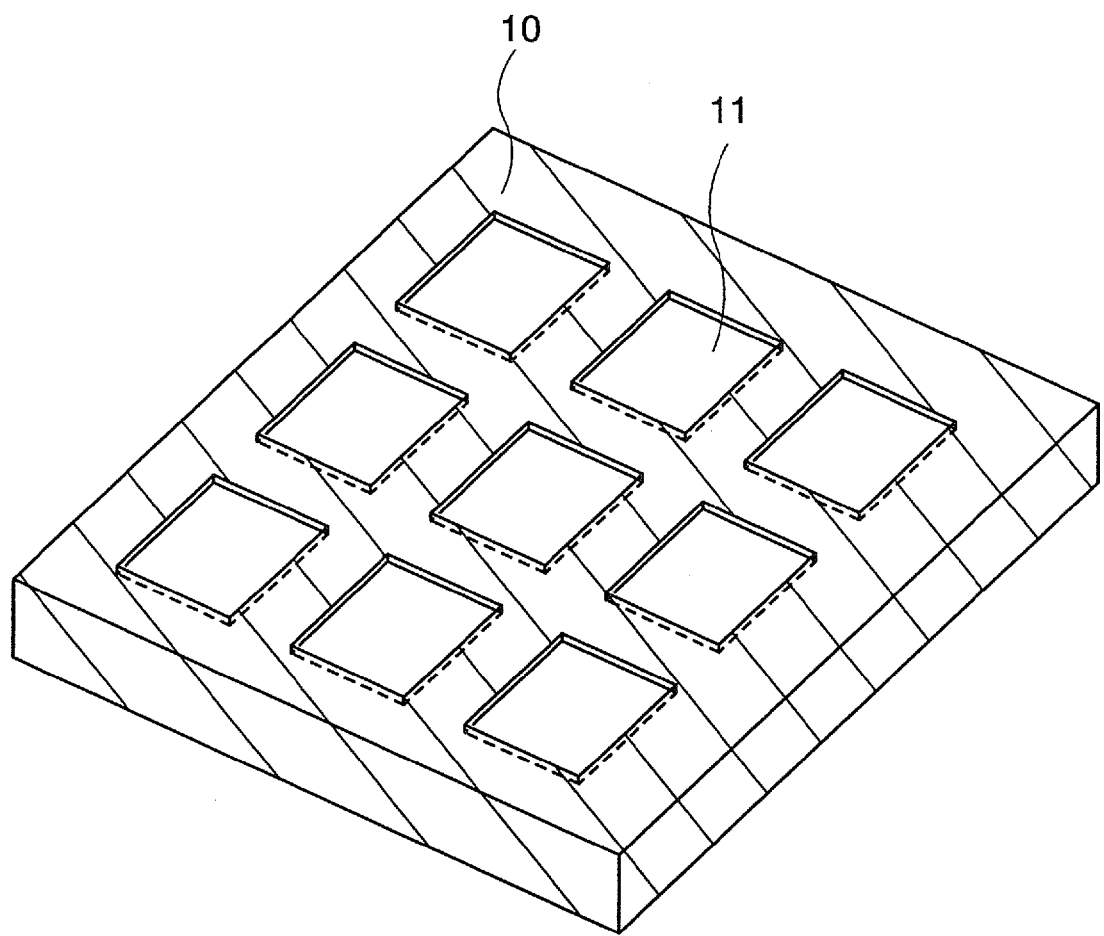
FIG. 3 is a diagram showing an example of a tray.
Figure 4:
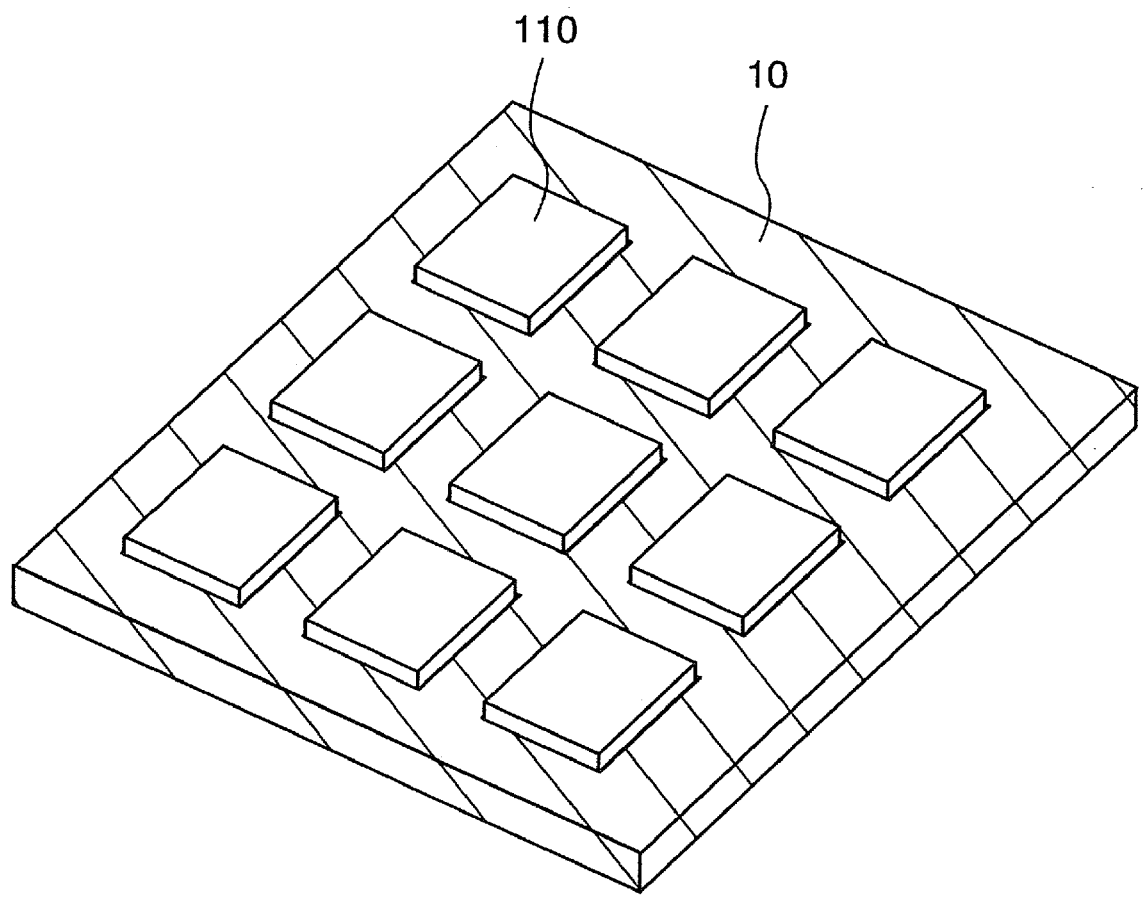
FIG. 4 is a diagram showing a state where single crystal semiconductor substrates are arranged in a tray.

After cleaning the single crystal semiconductor substrate 110, a plurality of single crystal semiconductor substrates 110 are arranged in a tray 10. FIG. 3 is an external view showing an example of a structure of the tray 10. The tray 10 is a plate-like member provided with a plurality of depressions 11 for holding the single crystal semiconductor substrates 110. In the tray 10 shown in FIG. 3, the depressions 11 are formed in three rows and three columns. It is needless to say that the present invention is not interpreted as being limited to the structure, and the number of rows and columns can be changed as appropriate. With the use of the tray 10, the single crystal semiconductor substrates 110 are arranged in the depressions 11 of the tray 10 as shown in FIG. 4.

The tray 10 is formed from a material which does not change in shape and property by heat treatment in a process for manufacturing the semiconductor substrate 100. In particular, it is preferable to select a material with less thermal expansion. For example, the tray 10 can be manufactured using a material such as quartz glass or stainless steel.

The thickness of the tray 10 can be set to be, for example, greater than or equal to 1.1 mm and less than or equal to 2 mm. Of course, the thickness of the tray 10 is not limited thereto as long as a certain level of strength can be ensured. The depth of the depression 11 can be set to be, for example, greater than or equal to 0.2 mm and less than or equal to 0.6 mm, preferably greater than or equal to 0.3 mm and less than or equal to 0.5 mm. Note that the depth of the depression 11 is acceptable as long as the single crystal semiconductor substrate 110 can be held therein, and not limited to the above-described depth. The size of the tray 10 is preferably set to be the same as or substantially the same as the size of the base substrate 101. This is because alignment at the time of bonding is facilitated by setting the size of the tray 10 to be the same as or substantially the same as the size of the base substrate. The depression 11 is made to have a size enough for the single crystal semiconductor substrate 110 to fit in the depression 11. Preferably, the size of the depression 11 is set to be the same as or substantially the same as the size of the single crystal semiconductor substrate 110. For example, a side of the depression 11 and a corresponding side of the single crystal semiconductor substrate 110 may be set so that a difference in length is at most 0.5 mm. In this manner, the size of the depression 11 is set to be the same as or substantially the same as the size of the single crystal semiconductor substrate 110, whereby positional accuracy at the time of bonding can be drastically improved. Note that in the manufacturing method of this embodiment mode, the size and arrangement of the single crystal semiconductor layers 116 in the semiconductor substrate 100 are determined depending on the size and arrangement of the depressions 11.

Figure 5A:
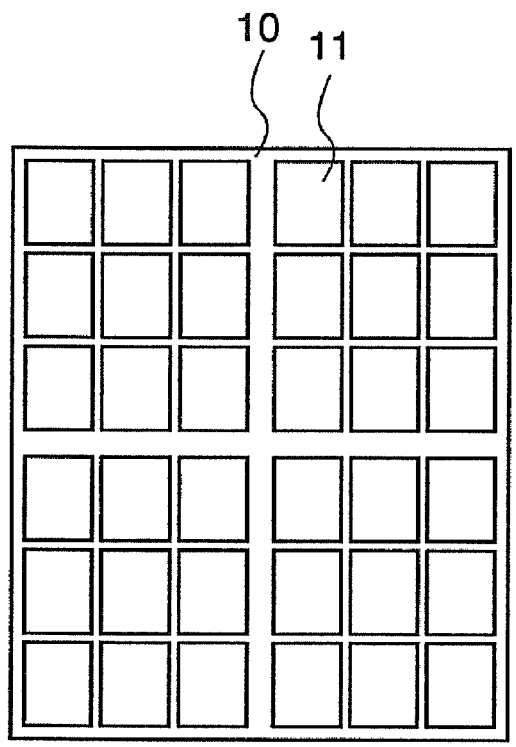
FIGS. 5A and 5B are diagrams each showing an example of a tray.
Figure 5B:
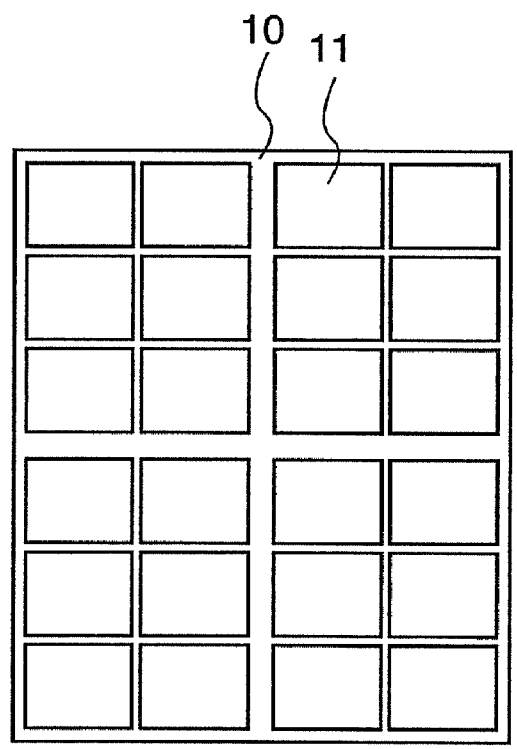
Figure 6A:
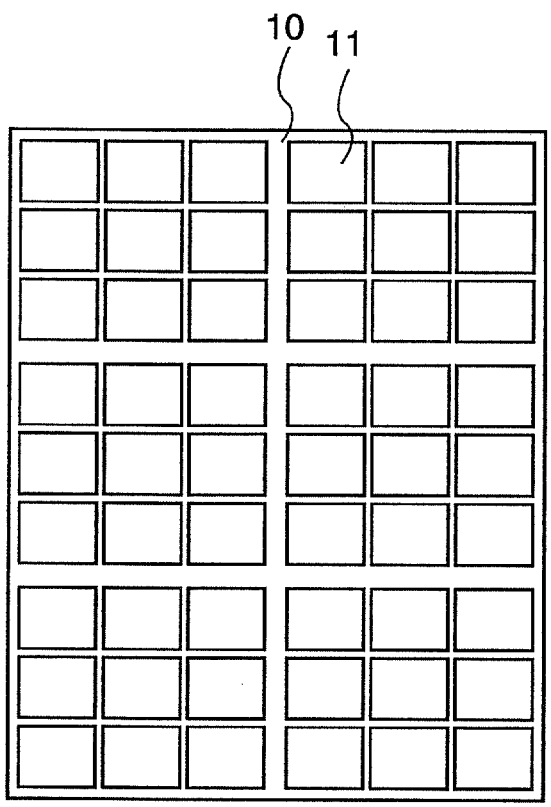
FIGS. 6A and 6B are diagrams each showing an example of a tray.
Figure 6B:
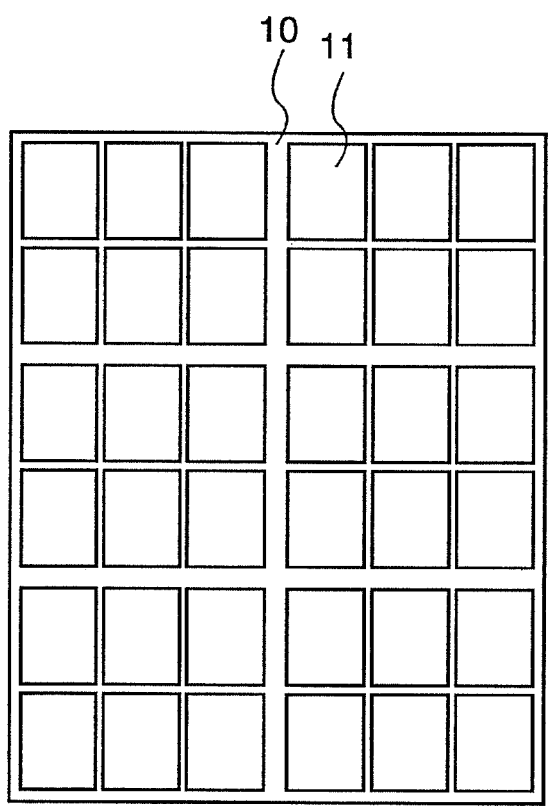

FIGS. 5A and 5B and FIGS. 6A and 6B are top views showing structural examples of the tray 10. FIGS. 5A and 5B are plan views of the tray 10 in the case of using mother glass having a size of 600 mm×720 mm as the base substrate 101, and the size of the tray 10 is 600 mm×720 mm, which is the same as that of the mother glass. FIGS. 6A and 6B are plan views of the tray 10 in the case of using 4th generation mother glass having a size of 730 mm×920 mm as the base substrate 101, and the size of the tray 10 is 730 mm×920 mm, which is the same as that of the mother glass.

FIG. 5A is a plan view of the tray 10, in which the size and arrangement of the depressions 11 are taken into consideration so as to correspond to a stepper with a light exposure region of 4 square inches. The tray 10 is sectioned into four blocks, and each block is provided with nine depressions 11 arranged in three rows and three columns. The size of each depression 11 is 102 mm×82 mm, which fits in a light exposure region for one shot. In each block, the distance between the depressions 11 is 11 mm in both a longitudinal direction and a lateral direction, and the distance between the edge of the tray 10 and the depression 11 is 16 mm in both a longitudinal direction and a lateral direction.

FIG. 5B is a plan view of the tray 10, in which the size and arrangement of the depressions 11 are taken into consideration so as to correspond to a stepper with a light exposure region of 5 square inches. The tray 10 is sectioned into four blocks, and each block is provided with six depressions 11 arranged in three rows and two columns. The size of each depression 11 is 102 mm×130 mm, which fits in a light exposure region for one shot. In each block, the distance between the depressions 11 in a longitudinal direction is 11 mm and the distance between the depressions 11 in a lateral direction is 10 mm. The distance between the edge of the tray 10 and the depression 11 is 16 mm in both a longitudinal direction and a lateral direction.

FIG. 6A is a plan view of the tray 10, in which the size and arrangement of the depressions 11 are taken into consideration so as to correspond to a stepper with a light exposure region of 4 square inches. The tray 10 is sectioned into six blocks, and each block is provided with nine depressions 11 arranged in three rows and three columns. The size of each depression 11 is 105 mm×84 mm, which fits in a light exposure region for one shot. In each block, the distance between the depressions 11 in a longitudinal direction is 11 mm and the distance between the depressions 11 in a lateral direction is 10 mm. The distance between the edge of the tray 10 and the depression 11 in a longitudinal direction is 16 mm, and the distance between the edge of the tray 10 and the depression 11 in a lateral direction is 15 mm.

FIG. 6B is a plan view of the tray 10, in which the size and arrangement of the depressions 11 are taken into consideration so as to correspond to a stepper with a light exposure region of 5 square inches. The tray 10 is sectioned into six blocks, and each block is provided with six depressions 11 arranged in two rows and three columns. The size of each depression 11 is 132 mm×105 mm, which fits in a light exposure region for one shot. In each block, the distance between the depressions 11 in a longitudinal direction is 13 mm and the distance between the depressions 11 in a lateral direction is 10 mm. The distance between the edge of the tray 10 and the depression 11 is 15 mm in both a longitudinal direction and a lateral direction.

Note that the above-described structures of the tray 10 are just examples, and the present invention is not interpreted as being limited to the structures. For example, a structure may be used in which the single crystal semiconductor substrates 110 are continuously arranged, with the distance between the depressions 11 in each block narrowed. In this case, the single crystal semiconductor substrates are arranged so that a gap between the single crystal semiconductor layers to be formed is set to be less than or equal to 0.5 mm, preferably less than or equal to 0.3 mm, whereby the single crystal semiconductor layers which can be regarded as continuous (which can be regarded as seamless) can be formed. Further, a larger tray can be used to be adapted to larger mother glass. Of course, the size of the depression 11 and the size of the single crystal semiconductor substrate 110 to be used may be changed as appropriate depending on projection ability of a light exposure apparatus.

Figure 7A:
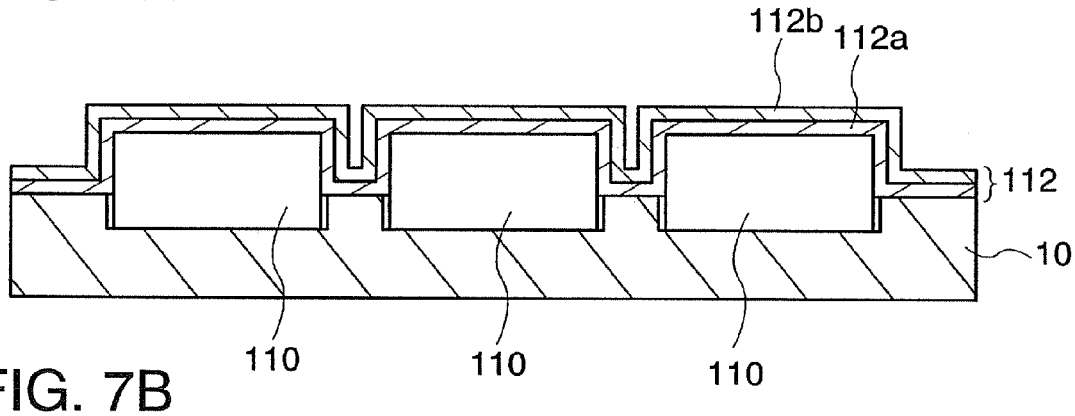
FIGS. 7A to 7D are cross-sectional views showing a method for manufacturing a semiconductor substrate.

After the single crystal semiconductor substrates 110 are arranged in the tray 10 as shown in FIG. 4, an insulating layer 112 is formed over each of the single crystal semiconductor substrates 110 as shown in FIG. 7A. For the insulating layer 112, a single-layer structure or a multilayer structure including two or more layers can be used. The thickness of the insulating layer 112 can be set in the range of from 5 nm to 400 nm inclusive. As a manufacturing method, a CVD method, a sputtering method, a method for oxidizing or nitriding surfaces of the single crystal semiconductor substrates 110, and the like can be given. As a film included in the insulating layer 112, an insulating film containing silicon or germanium as its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including metal oxide, such as an aluminum oxide film, a tantalum oxide film, or a hafnium oxide film; an insulating film including a metal nitride, such as an aluminum nitride film; an insulating film including a metal oxynitride, such as an aluminum oxynitride film; an insulating film including metal nitride oxide, such as an aluminum nitride oxide film; or the like can also be used.

Note that in this specification, a silicon oxynitride means the one that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, a silicon nitride oxide film shows a film that has greater content of nitrogen than that of oxygen, and for example, silicon nitride oxide includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The aforementioned ranges are ranges for cases measured using Rutherford backscattering spectrometry (RBS) and hydrogen forward scattering (HFS). Moreover, the total for the content percentages of the constituent elements do not exceed 100 at. %.

When a substrate including an impurity which may decrease the reliability of a semiconductor device, such as alkali metal or alkaline-earth metal, is used for the base substrate 101, the insulating layer 112 is preferably provided with at least one film capable of preventing diffusion of the impurity from the base substrate 101 into the semiconductor layer of the SOI substrate. As such a film, a silicon nitride film, a silicon nitride oxide film, an aluminum nitride film, an aluminum nitride oxide film, and the like can be given. By including such a film, the insulating layer 112 can function as a barrier layer.

For example, in the case of forming the insulating layer 112 as a barrier layer with a single-layer structure, the insulating layer 112 may be formed of a silicon nitride film, a silicon nitride oxide film, an aluminum nitride film, or an aluminum nitride oxide film each having a thickness of from 5 nm to 200 nm inclusive.

In the case of forming the insulating layer 112 as a barrier layer with a two-layer structure, the upper layer is formed of an insulating film with a high barrier property. For example, a silicon nitride film, a silicon nitride oxide film, an aluminum nitride film, or an aluminum nitride oxide film each having a thickness of approximately from 5 nm to 200 nm inclusive can be used. Such a film has a high blocking effect for preventing impurity diffusion, and in addition, the internal stress is high. Therefore, it is preferable that a film having an effect of relieving the stress of the upper insulating film be selected as a lower insulating film which is in contact with the single crystal semiconductor substrates 110. As such an insulating film, a silicon oxide film, a silicon oxynitride film, a thermal oxide film formed by thermally oxidizing the single crystal semiconductor substrate 110, or the like is given. The thickness of the lower insulating film can be set to be greater than or equal to 5 nm and less than or equal to 300 nm, for example.

In this embodiment mode, the insulating layer 112 has a two-layer structure including the insulating film 112a and the insulating film 112b. As a combination of the insulating film 112a and the insulating film 112b in the case of functioning the insulating layer 112 as a barrier layer, for example, the following combinations are given: a silicon oxide film and a silicon nitride film, a silicon oxynitride film and a silicon nitride film, a silicon oxide film and a silicon nitride oxide film, a silicon oxynitride film and a silicon nitride oxide film, and the like.

For example, as the lower insulating film 112a, a silicon oxynitride film formed using $SiH_4$ and $N_2O$ for a process gas by a plasma enhanced CVD method (hereinafter, also referred to as a PECVD method) can be used. Alternatively, a silicon oxide film formed using an organosilane gas and oxygen for a process gas by a PECVD method may be used. Further alternatively, an oxide film formed by oxidizing the single crystal semiconductor substrate 110 may be used as the insulating film 112a.

The organosilane refers to organic compounds each containing a silicon atom, such as tetraethyl orthosilicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

As the upper insulating film 112b, a silicon nitride oxide film formed using $SiH_4$, $N_2O$, $NH_3$, and $H_2$ for a process gas by a PECVD method can be used. Alternatively, a silicon nitride film formed using $SiH_4$, $N_2$, $NH_3$, and $H_2$ for a process gas by a PECVD method may be used.

In the case of forming the insulating film 112a made of silicon oxynitride and the insulating film 112b made of silicon nitride oxide by a PECVD method, for example, the following method can be employed: the plurality of single crystal semiconductor substrates 110 arranged in the tray 10 are carried in a treatment chamber of a PECVD apparatus, plasma of a mixed gas of $SiH_4$ and $N_2O$ is produced, and a silicon oxynitride film is formed over the single crystal semiconductor substrate 110; then, a gas to be introduced into the treatment chamber is changed to $SiH_4$, $N_2O$, $NH_3$, and $H_2$, and plasma of the mixed gas of these is produced, so that a silicon nitride oxide film can be successively formed over the silicon oxynitride film. In the case of using a PECVD apparatus with a plurality of treatment chambers, a silicon oxynitride film and a silicon nitride oxide film can be formed in different treatment chambers. Of course, a silicon oxide film can be formed as the lower insulating film and a silicon nitride film can be formed as the upper insulating film by changing a gas to be introduced into a treatment chamber.

The insulating film 112a and the insulating film 112b are formed in the manner described above, whereby the insulating layer 112 can each be formed over the plurality of single crystal semiconductor substrates 110 with high throughput. Further, the insulating film 112a and the insulating film 112b can be formed without being exposed to the air; thus, an interface between the insulating film 112a and the insulating film 112b can be prevented from being contaminated by the air.

Further, as the insulating film 112a, an oxide film formed by subjecting the single crystal semiconductor substrate 110 to oxidation treatment can be used. Dry oxidation may be used as thermal oxidation treatment for forming the oxide film; however, a gas including halogen is preferably added to an oxidizing atmosphere. As the gas including halogen, one or more kinds of gases selected from HCl, HF, $NF_3$, HBr, Cl, ClF, $BCl_3$, F, $Br_2$, or the like can be used.

For example, heat treatment is performed at a temperature of greater than or equal to 700° C. in an atmosphere containing HCl at a proportion of from 0.5 volume % to 10 volume % inclusive (preferably, approximately 3 volume %) with respect to oxygen. As an example, thermal treatment may be performed at a heating temperature of greater than or equal to 950° C. and less than or equal to 1100° C. The treatment time can be 0.1 to 6 hours inclusive, preferably 0.5 to 1 hour inclusive. The film thickness of an oxide film to be formed can be 10 nm to 1000 nm inclusive (preferably, 50 nm to 200 nm inclusive), for example, 100 nm.

By oxidation treatment being performed at such a temperature range, a gettering effect (an effect of removing a metal impurity) with a halogen element can be obtained. That is, with action of chlorine, an impurity such as metal turns into a volatile chloride and is released into a gas phase, thereby being removed from the single crystal semiconductor substrate 110. Further, a defect in a surface of the single crystal semiconductor substrate 110 is terminated by the halogen element included in the oxidizing atmosphere; thus, local level density at an interface between the oxide film and the single crystal semiconductor substrate 110 can be reduced.

By thermal oxidation treatment in the atmosphere containing halogen, halogen can be contained in the oxide film. The halogen element is contained at a concentration of $1 \times 10^{17}$ to $5 \times 10^{20}$ atoms/$cm^3$ inclusive, thereby trapping impurities such as metal to function as a protective film, which prevents contamination of the single crystal semiconductor layer 116, in the semiconductor substrate 100.

In the case of forming the lower insulating film 112a by thermal oxidation treatment and forming the upper insulating film 112b by a gas phase method such as a PECVD method, the insulating film 112a can be formed by thermal oxidation treatment before the single crystal semiconductor substrates 110 are arranged in the tray 10, the single crystal semiconductor substrates 110 each provided with the insulating film 112a can be arranged in the tray 10, and then, the insulating film 112b can be formed.

Figure 7B:
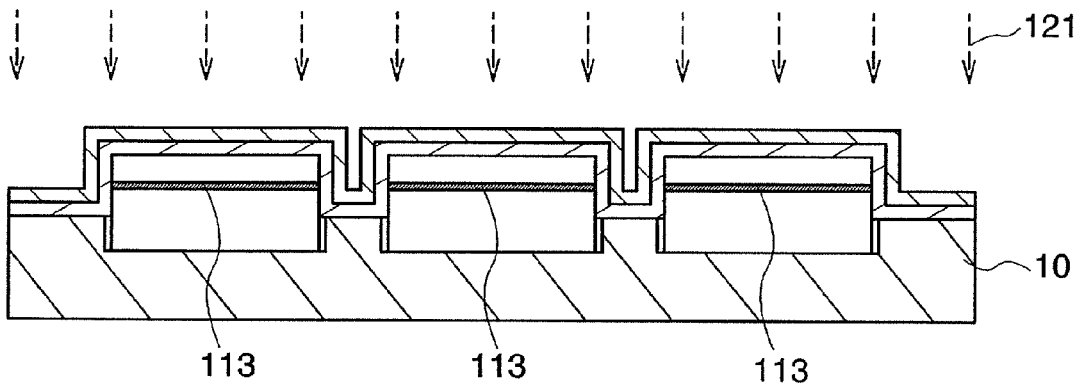

Next, as shown in FIG. 7B, the single crystal semiconductor substrates 110 are irradiated with an ion beam 121 including ions accelerated by an electric field through the insulating layer 112, whereby a damaged region 113 is formed in a region of each of the single crystal semiconductor substrates 110 at a predetermined depth from the surface thereof. A depth of a region in which the damaged region 113 is formed is the same as or substantially the same as an average depth of penetration of ions, and can be controlled by acceleration energy of the ion beam 121 and an incident angle of the ion beam 121. The acceleration energy can be controlled by an acceleration voltage, dosage, or the like. Note that the thickness of a semiconductor layer separated from the single crystal semiconductor substrate 110 is determined depending on the depth at which ions enter. The depth at which the damaged region 113 is formed may range from 50 nm to 500 nm inclusive, preferably from 50 nm to 200 nm inclusive.

As a method for irradiating the single crystal semiconductor substrates 110 with ions, it is more preferable to use an ion doping method in which mass separation is not performed than an ion implantation method in which mass separation is performed. This is because time needed to form the damaged region 113 in each of the plurality of single crystal semiconductor substrates 110 arranged in the tray 10 can be shortened by using an ion doping method.

In the case of using an ion doping method, the single crystal semiconductor substrates 110 which have been fitted in the tray 10 are transferred to a treatment chamber of an ion doping apparatus. Plasma is produced by exciting a process gas, desired ions are extracted from the plasma and accelerated to generate the ion beam 121, and the plurality of single crystal semiconductor substrates 110 are irradiated with the ion beam 121, whereby ions are introduced at a predetermined depth to form high concentration regions. Thus, the damaged region 113 is formed.

When hydrogen ($H_2$) is used for a source gas, $H^+$, $H_2^+$, and $H_3^+$ can be produced by exciting a hydrogen gas. The proportion of ion species produced from a source gas can be changed by regulating a method for exciting plasma, a pressure of an atmosphere for producing plasma, a supply of the source gas, or the like. In the case of performing ion irradiation by an ion doping method, the proportion of the amount of contained $H_3^+$ in the total amount of ions in the ion beam 121 is at least 50% or more, preferably 70% or more, more preferably 80% or more. The proportion of $H_3^+$ is made to be 50% or more, whereby the proportion of $H^+$ and $H_2^+$ which are contained in the ion beam 121 becomes comparatively small. Therefore, variation in an average depth of penetration of the hydrogen ions contained in the ion beam 121 can be reduced. Thus, irradiation efficiency of ions can be improved and the time needed for the ion irradiation can be shortened. Further, since $H_3^+$ has a larger mass than $H^+$ and $H_2^+$, penetration of $H_3^+$ to a shallow depth is possible when ions of $H^+$, $H_2^+$, and $H_3^+$ have the same energy. That is, the thickness of the semiconductor layer can be reduced. Note that a profile of $H_3^+$ in the single crystal semiconductor substrate is steeper than those of $H^+$ and $H_2^+$. Thus, separation can be favorably performed even when the total amount of ions is small.

In the case of performing ion irradiation by an ion doping method with the use of the hydrogen gas as the source gas, the acceleration voltage can be set in the range of from 10 kV to 200 kV inclusive, and the dosage is set in the range of from $1 \times 10^{16}$ ions/$cm^2$ to $6 \times 10^{16}$ ions/$cm^2$ inclusive. By the irradiation with the hydrogen ions under this condition, the damaged region 113 can be formed at a depth of from 50 nm to 500 nm inclusive in each of the single crystal semiconductor substrates 110, though it depends on the ion species in the ion beam 121 and their proportion.

For example, in the case where the single crystal semiconductor substrate 110 is a single crystal silicon substrate; the insulating film 112a is a 50-nm-thick silicon oxynitride film; and the insulating film 112b is a 50-nm-thick silicon nitride oxide film, a single crystal semiconductor layer with a thickness of about 120 nm can be separated from the single crystal semiconductor substrate 110 under the following condition: a source gas is hydrogen, the acceleration voltage is 40 kV, and the dosage is $2.2 \times 10^{16}$ ions/$cm^2$. Alternatively, when the irradiation with the hydrogen ions is performed under the aforementioned condition except that the insulating film 112a is a 100-nm-thick silicon oxynitride film, a semiconductor layer with a thickness of about 70 nm can be separated from the single crystal semiconductor substrate 110.

Alternatively, as the source gas of the ion beam 121, helium (He) may be used. Since most of the ion species produced by exciting helium are $He^+$, the single crystal semiconductor substrates 110 can be irradiated with $He^+$ as main ions even in an ion doping method in which mass separation is not performed. Therefore, the damaged regions 113 can be formed efficiently by an ion doping method. When ion irradiation is performed by an ion doping method using helium, the acceleration voltage may be set in the range of from 10 kV to 200 kV inclusive, and the dosage may be set in the range of from $1\times10^{16}$ ions/cm$^2$ to $6\times10^{16}$ ions/cm$^2$ inclusive. Further alternatively, a halogen gas such as a chlorine gas (Cl$_2$ gas) or a fluorine gas (F$_2$ gas) can be used as the source gas.

Figure 7C:
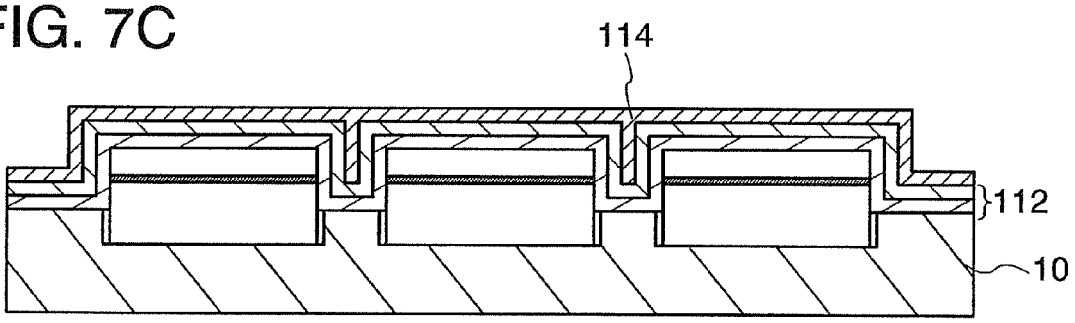

After forming the damaged region 113, a bonding layer 114 is formed over the top surface of the insulating layer 112 as shown in FIG. 7C. In a process for forming the bonding layer 114, the heat temperature of the single crystal semiconductor substrate 110 is set at a temperature at which an element or a molecule which is present in the damaged region 113 is not precipitated, and the heat temperature is preferably 400° C. or lower, more preferably 350° C. or lower. In other words, the damaged region 113 does not release gas within this heat temperature range. Note that the bonding layer 114 can be formed before the ion irradiation process. In this case, the process temperature at the time of forming the bonding layer 114 can be set to 350° C. or more.

The bonding layer 114 is a smooth layer having a hydrophilic surface. The arithmetic mean roughness Ra of a surface of the bonding layer 114 is less than or equal to 0.7 nm, preferably less than or equal to 0.4 nm. Further, the thickness of the bonding layer 114 can be set to be greater than or equal to 5 nm and less than or equal to 500 nm, more preferably greater than or equal to 10 nm and less than or equal to 200 nm.

As the bonding layer 114, an insulating film formed by a chemical gas phase reaction is preferably used, and it is especially preferable to use a silicon oxide film. In the case of forming a silicon oxide film by a plasma enhanced CVD method as the bonding layer 114, it is preferable to use an organosilane gas and an oxygen (O$_2$) gas as a source gas. By using organosilane as the source gas, it is possible to form a silicon oxide film having a smooth surface at a process temperature of 400° C. or lower.

For example, in order to form the bonding layer 114 formed of a silicon oxide film using TEOS and O$_2$ as the source gas, the following condition may be employed: the flow rate of TEOS is 15 sccm, the flow rate of O$_2$ is 750 sccm, the film formation pressure is 100 Pa, the film formation temperature is 300° C., the power frequency is 13.56 MHz, and the RF output is 300 W.

A silicon oxide film functioning as the bonding layer 114 can be formed by a thermal CVD method other than a plasma enhanced CVD method. In this case, monosilane (SiH$_4$), disilane (Si$_2$H$_6$), or the like can be used for the silicon source gas, and an oxygen (O$_2$) gas, a dinitrogen monoxide (N$_2$O) gas, or the like can be used for the oxygen source gas. The heating temperature is preferably greater than or equal to 200° C. and less than or equal to 500° C. Note that the bonding layer 114 is mostly formed from an insulating material, and the bonding layer 114 is broadly included in an insulating layer. It is likely that the bonding layer 114 which is formed in a manner like the above-described method is favorable for bonding at a low temperature. This is because an OH group is present at a surface of the above-describe bonding layer 114. Although a mechanism relating to bonding is not completely resolved, it is likely that Si—O—Si is formed by reaction of Si—OH and Si—OH, or Si—O—Si is formed by reaction of Si—H and Si—OH.

Figure 7D:
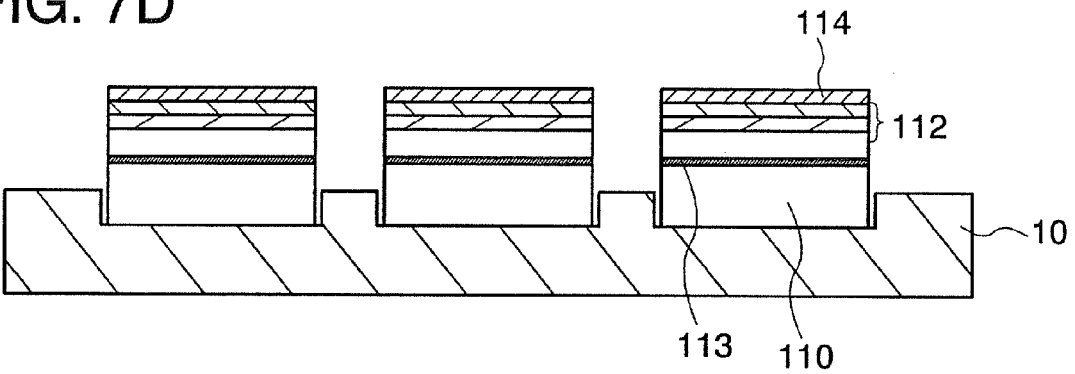

Next, the single crystal semiconductor substrates 110 each provided with the insulating layer 112 and the bonding layer 114 are detached from the tray 10, and the plurality of single crystal semiconductor substrates 110 are cleaned. The cleaning process can be performed by ultrasonic cleaning using pure water. As the ultrasonic cleaning, megahertz ultrasonic cleaning (megasonic cleaning) is preferable. The single crystal semiconductor substrates 110 may be cleaned with ozone water after the ultrasonic cleaning. By cleaning with the use of ozone water, organic substances can be removed and surface activation treatment which improves a hydrophilic property of the surface of the bonding layer 114 can be performed. After terminating the cleaning treatment and the surface activation treatment, the single crystal semiconductor substrates 110 are arranged in the depressions 11 of the tray 10 as shown in FIG. 7D. Note that this embodiment mode describes a case where the single crystal semiconductor substrates 110 are detached from the tray 10 and are subjected to the cleaning treatment and the activation treatment; however, the present invention is not interpreted as being limited thereto. In the case where contamination of the single crystal semiconductor substrates 110 or the like does not become a problem, it is not necessary to clean the single crystal semiconductor substrates 110. Further, even when the cleaning treatment and the surface activation treatment are performed, the treatment can be performed without detaching the single crystal semiconductor substrates 110 from the tray 10.

As the activation treatment of the surface of the bonding layer 114, irradiation treatment with an atomic beam or an ion beam, plasma treatment, radical treatment, and the like can be given as well as cleaning with ozone water. When an atomic beam or an ion beam is used, an inert gas neutral atom beam or an inert gas ion beam of argon or the like can be used.

Next, the single crystal semiconductor substrates 110 arranged in the tray 10 are bonded to the base substrate 101. Before the bonding, the base substrate 101 is preferably cleaned. As examples of the cleaning of the base substrate 101, cleaning with a hydrochloric acid and a hydrogen peroxide solution, megahertz ultrasonic cleaning, and the like are given. Further, surface activation treatment is preferably performed on a surface to be a bonding surface of the base substrate 101 in a manner similar to the bonding layer 114.

Figure 8A:
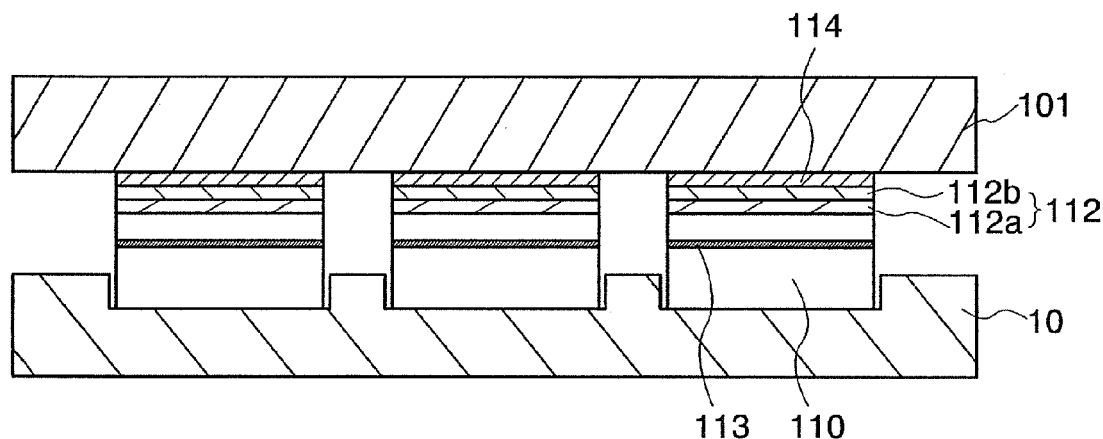
FIGS. 8A and 8B are cross-sectional views showing a method for manufacturing a semiconductor substrate.

FIG. 8A is a cross-sectional view illustrating a bonding process. The base substrate 101 is disposed with respect to the tray 10 in which the plurality of single crystal semiconductor substrates 110 are arranged. Then, pressure of approximately greater than or equal to 300 N/cm$^2$ and less than or equal to 15000 N/cm$^2$ is applied to a predetermined portion (for example, an edge portion) of the base substrate 101. The pressure is preferably approximately greater than or equal to 1000 N/cm$^2$ and less than or equal to 5000 N/cm$^2$. By application of pressure, the bonding layer 114 and the base substrate 101 start to be disposed in close contact with each other from a portion to which pressure is applied. After a while, all the single crystal semiconductor substrates 110 in the tray 10 are disposed in close contact with one base substrate, which is the base substrate 101. Since the bonding process does not need heat treatment and can be performed at room temperature, a substrate with low resistance against heat, such as a glass substrate, can be used as the base substrate 101.

Note that in the present invention, the plurality of single crystal semiconductor substrates 110 are arranged in the tray 10; thus, there may be a case of generating the single crystal semiconductor substrate 110 which is not in contact with the base substrate 101 due to a difference in a thickness of the single crystal semiconductor substrates 110. Therefore, pressure is preferably applied to a plurality of places, not to one place. More preferably, pressure is applied to each of the single crystal semiconductor substrates 110. Note that even in the case where there is a variation in a height of surfaces of the bonding layers 114 to some degree in the state where the single crystal semiconductor substrates 110 are arranged in the tray 10, a bond can be formed throughout the surface of the bonding layer 114 when part of the bonding layer 114 comes in contact with the base substrate 101 due to warpage of the base substrate 101.

Figure 9:
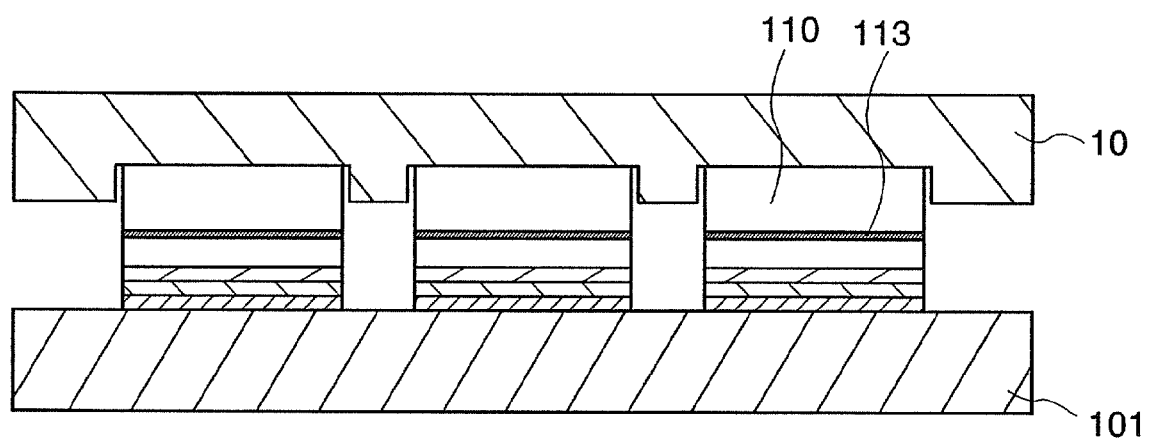
FIG. 9 is a cross-sectional view showing a method of manufacturing a semiconductor substrate.

Further, after putting the base substrate 101 on the tray 10 as shown in FIG. 8A, the resulting structure is inverted so that the base substrate 101 comes to the lower side as shown in FIG. 9. Thus, the base substrate 101 and the single crystal semiconductor substrates 110 can be made to come in contact with each other due to the weights of the single crystal semiconductor substrates 110. Accordingly, a bond can be easily formed regardless of a difference in a thickness of the single crystal semiconductor substrates 110.

After bonding the base substrate 101 and the single crystal semiconductor substrates 110 to each other, heat treatment is preferably performed in order to increase a bonding force at the bonding interface between the base substrate 101 and each of the bonding layers 114. The heat treatment can be performed at a temperature at which the damaged region 113 does not crack, for example, at a temperature in the range of 200° C. to 450° C. inclusive. By bonding the single crystal semiconductor substrates 110 to the base substrate 101 while heating at a temperature in the above-described range, a bonding force at the bonding interface between the base substrate 101 and the bonding layer 114 can be increased.

If a bonding surface is contaminated by dust or the like in disposing the base substrate 101 over the single crystal semiconductor substrates 110, bonding is not performed in the contaminated portion. In order to prevent such contamination of the bonding surface, it is preferable that the base substrate 101 be disposed over the single crystal semiconductor substrates 110 in a treatment chamber with an airtight structure (an airtight chamber). Further, it is preferable that the treatment chamber be in a state with reduced pressure of approximately $5.0 \times 10^{-3}$ Pa and an atmosphere in which bonding treatment is performed be cleaned.

Figure 8B:
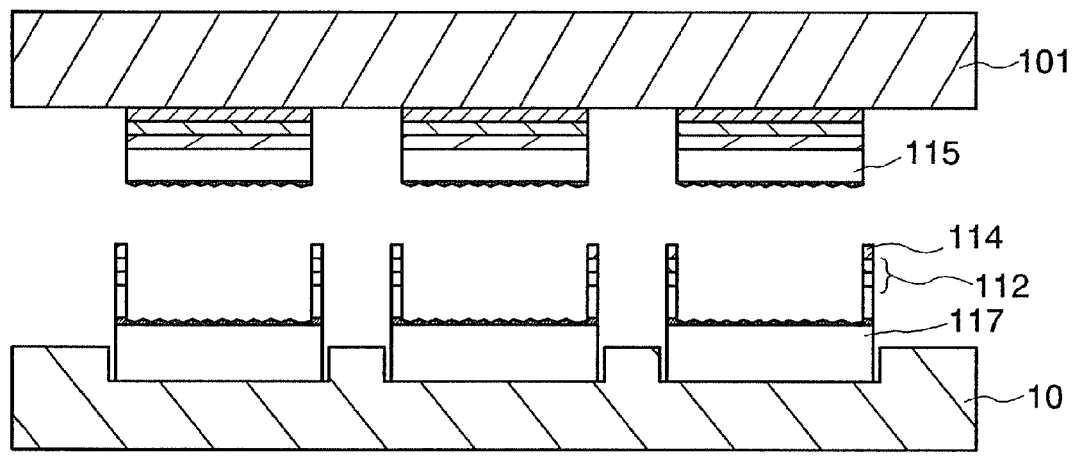

Next, heat treatment is performed, so that each of the single crystal semiconductor substrates 110 is separated along the damaged region 113. FIG. 8B is a diagram illustrating a process in which each of the semiconductor layers 115 is separated from the single crystal semiconductor substrate 110. Note that, here, a single crystal semiconductor substrate from which the semiconductor layer 115 has been separated is referred to as a single crystal semiconductor substrate 117.

By the heat treatment, an element which is present in the damaged region 113 is precipitated, and pressure in microvoids of the damaged region 113 is increased. Due to the increase in pressure, volume of the microvoids of the damaged region 113 is changed, and the damaged region 113 is cracked. Accordingly, the single crystal semiconductor substrate 110 is separated along the damaged region 113. Since the bonding layers 114 are bonded to the base substrate 101, the semiconductor layers 115 separated from the single crystal semiconductor substrates 110 are fixed to the base substrate 101. The temperature of the heat treatment for separating the semiconductor layers 115 from the single crystal semiconductor substrates 110 is set so as not to exceed the strain point of the base substrate 101.

For the heat treatment, a rapid thermal anneal (RTA) apparatus, a resistance heating furnace, a microwave heating apparatus, or the like can be used. For an RTA apparatus, a gas rapid thermal anneal (GRTA) apparatus and a lamp rapid thermal anneal (LRTA) apparatus are given.

In the case of using a GRTA apparatus, heat treatment at a heating temperature of higher than or equal to 550° C. and lower than or equal to 650° C. and with treatment time of longer than or equal to 0.5 minutes and shorter than or equal to 60 minutes can be applied. In the case of using a resistance heating apparatus, heat treatment at a heating temperature of higher than or equal to 200° C. and lower than or equal to 650° C. and with treatment time of longer than or equal to 2 hours and shorter than or equal to 4 hours can be applied. In the case of using a microwave processing apparatus, a microwave frequency is set to 2.45 GHz and heat treatment with treatment time of longer than or equal to 10 minutes and shorter than or equal to 20 minutes can be applied.

A specific method of heat treatment using a vertical furnace having a resistance heating device is described. First, the base substrate 101, to which the single crystal semiconductor substrates 110 arranged in the tray 10 are bonded, is disposed in a boat of a vertical furnace. The boat is transferred to a chamber of the vertical furnace. The inside of the chamber is set to a vacuum state in order to suppress oxidation of the single crystal semiconductor substrates 110. The degree of vacuum may be set to be approximately $5 \times 10^{-3}$ Pa. After setting the chamber to a vacuum state, nitrogen is supplied to the chamber, so that the chamber is made to have a nitrogen atmosphere under an atmospheric pressure. During this process, the temperature is increased to 200° C.

After heating is performed at a temperature of 200° C. for two hours, the temperature is increased to 400° C. over one hour. When the state at a temperature of 400° C. becomes stable, the temperature is increased to 600° C. over another hour. When the state at a temperature of 600° C. becomes stable, heat treatment is performed at 600° C. for two hours. Then, the temperature is decreased to 400° C. over one hour, and after 10 to 30 minutes, the boat is transferred from the inside of the chamber. Next, under the atmospheric atmosphere, the single crystal semiconductor substrates 117 arranged in the tray 10 and the base substrate 101 provided with the semiconductor layers 115 on the boat are cooled.

In the heat treatment using the resistance heating furnace, heating treatment for increasing a bonding force between each of the bonding layers 114 and the base substrate 101 and heat treatment for causing separation in the damaged regions 113 are successively performed. In the case of performing these two heat treatments with the use of different apparatuses, the following process can be performed, for example. First, heat treatment is performed at 200° C. for 2 hours using a resistance heating furnace. Then, the base substrate 101 and the single crystal semiconductor substrates 110, which are bonded to each other, are transferred from the furnace; then, heat treatment is performed at a temperature higher than or equal to 600° C. and lower than or equal to 700° C. for 1 minute to 30 minutes inclusive, using an RTA apparatus. Thus, the single crystal semiconductor substrates 110 can be separated in the damaged regions 113.

Note that as shown in FIG. 8B, there are many cases in which a peripheral portion of the single crystal semiconductor substrate 110 is not bonded to the base substrate 101. It is likely that this is due to the following reasons: the base substrate 101 and the bonding layer 104 are not disposed in close contact with each other because the peripheral portion of the single crystal semiconductor substrate 110 is chamfered and has a curvature; the damaged region 113 is not easily divided in the peripheral portion of the single crystal semiconductor substrate 110; the peripheral portion has not enough planarity; the peripheral portion has a flaw or dirt; or the like. Therefore, the semiconductor layer 115 with the size smaller than the single crystal semiconductor substrate 110 is bonded to the base substrate 101. Further, a projection is formed in the periphery of the single crystal semiconductor substrate 117, and over the projection, the insulating film 112a, the insulating film 112b, and the bonding layer 114 which are not bonded to the base substrate 101 are left.

Figure 10A:
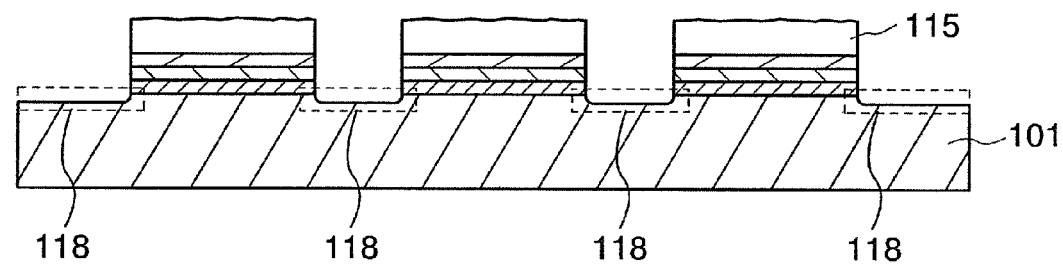
FIGS. 10A to 10C are cross-sectional views showing a method for manufacturing a semiconductor substrate.

Next, as shown in FIG. 10A, each of the semiconductor layers 115 is subjected to etching treatment or etch-back treatment, whereby the damaged regions are removed and each surface of the semiconductor layers 115 is planarized. In this embodiment mode, a dry etching method such as reactive ion etching (RIE), inductively coupled plasma (ICP) etching, electron cyclotron resonance (ECR) etching, parallel plate (capacitive coupled plasma) etching, magnetron plasma etching, dual-frequency plasma etching, or helicon wave plasma etching, may be used, for example.

When ICP etching is used, for example, etching may be performed under the following conditions: the flow rate of chlorine, which is an etching gas, is greater than or equal to 40 sccm and less than or equal to 100 sccm; power applied to a coil electrode is greater than or equal to 100 W and less than or equal to 200 W; power applied to a lower electrode (on the bias side) is greater than or equal to 40 W and less than or equal to 100 W; and the reaction pressure is greater than or equal to 0.5 Pa and less than or equal to 1.0 Pa. In this embodiment mode, the semiconductor layer 115 is etched by approximately 10 nm to 50 nm under the following conditions: the flow rate of chlorine, which is an etching gas, is set to 100 sccm; reaction pressure is set to 1.0 Pa; the temperature of a lower electrode (on the bias side) is set to 70° C.; RF (13.56 MHz) power applied to a coil electrode is set to 150 W, and power applied to a lower electrode (on the bias side) is set to 40 W. In the case of concurrently performing thinning, etching treatment may be performed so that the semiconductor layer 115 has a thickness of less than or equal to 100 nm, preferably 30 nm to 80 nm. For the etching gas, a chlorine-based gas such as chlorine, hydrogen chloride, boron chloride, silicon chloride, or carbon tetrachloride; a fluorine-based gas such as carbon tetrafluoride, sulfur fluoride, or nitrogen fluoride; oxygen; or the like can be used as appropriate.

By the above-described etching treatment, the damaged regions can be removed and each surface of the semiconductor layers 115 can be planarized. Further, in a region without the semiconductor layers 115, the depression 118 is formed by etching of the base substrate 101. The depth of the depression 118 is approximately greater than or equal to 2 nm and less than or equal to 20 nm, though it varies depending on an etching gas to be used. Of course, the depth of the depression 118 is not limited thereto in the case of using an etching gas by which the base substrate 101 is etched more easily as compared to the semiconductor layer 115.

In this manner, the depression 118 is provided by subjecting the surface of the base substrate 101 to etching treatment, whereby bending stress applied to a region where a bond is formed can be relieved, and the semiconductor layer 115 can be prevented from being separated from the base substrate 101. That is, even in the case where bending stress is generated in the base substrate by stress due to an external force in transferring the base substrate, by heat treatment in a process for manufacturing the semiconductor substrate, by heat treatment in a stage of manufacturing a semiconductor device, or the like, separation of the single crystal semiconductor layer from the base substrate can be prevented. The bending stress in a bond region is relieved because the bending stress is easily concentrated in the depression 118. Note that the depression preferably has a rounded shape (that is, a shape with a curvature or a shape without an angular portion), because in the case where the depression has an angular portion, there is a concern that the base substrate 101 may be broken due to concentration of stress applied to the angular portion.

Further, even when an impurity is present at the surface and the vicinity of the base substrate 101, deterioration of characteristics of a semiconductor device which is caused by intrusion of the impurity into the semiconductor layer 115 can be prevented. As an impurity which is present at the surface and the vicinity of the base substrate 101, an abrasive such as cerium oxide, iron oxide, or zirconium oxide which is used in polishing the surface of the base substrate 101; and a metal element such as alkali metal or alkaline-earth metal which is included in the base substrate are given. Note that planarity of the surface is significantly important to perform favorable bonding between the base substrate 101 and the semiconductor layer 115. Therefore, it is preferable to polish the surface of the base substrate 101.

Further, the depression 118 included in the base substrate 101 has the advantage that division can be favorably performed when the semiconductor devices are divided.

Note that the case of using a dry etching method is described in the above; however, a wet etching method may be used instead. In that case, it is to be noted that anisotropy of etching is weakened (isotropic etching is performed). It is important to perform etching treatment in accordance with a desired shape or the like of the depression 118.

Figure 10B:
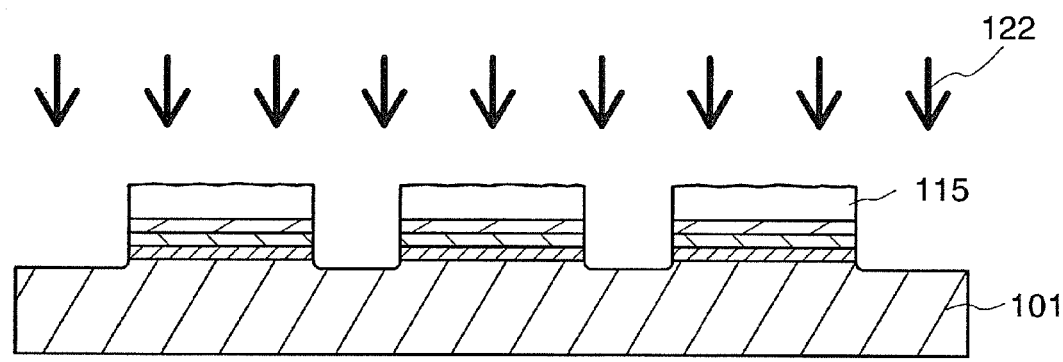

In the semiconductor layer 115 which is subjected to the above-described etching treatment or etch-back treatment, a crystal defect is present due to ion irradiation in forming the damaged region 113 or in separation in the damaged region 113. Further, it is hard to say that planarity of the surface of the semiconductor layer 115 can be sufficiently ensured only by the above-described etching treatment or etch-back treatment. In order to reduce such a crystal defect and to further improve planarity, in this embodiment mode, the semiconductor layers 115 is irradiated with a laser beam 122 as shown in FIG. 10B.

Figure 10C:
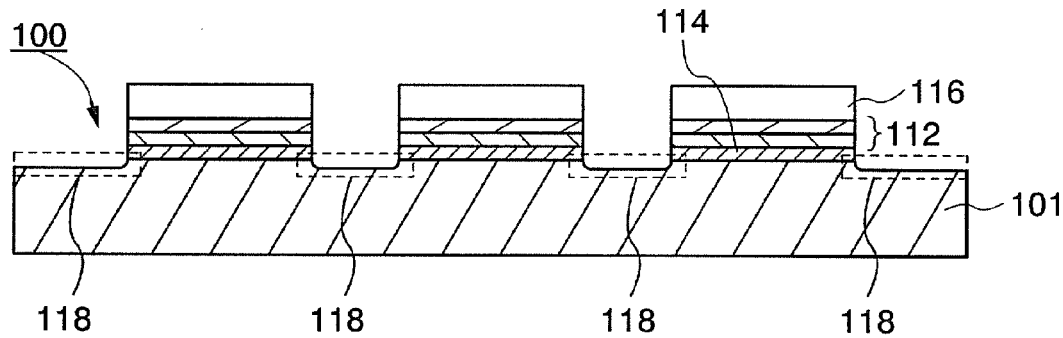

By irradiation with the laser beam 122 from the upper side of the semiconductor layers 115, the semiconductor layers 115 are melted from the upper surface. After the melting, the semiconductor layers 115 are cooled and solidified, whereby the single crystal semiconductor layers 116 in which planarity of the upper surfaces is improved as shown in FIG. 10C are formed. Note that FIG. 10C corresponds to FIG. 1.

In this embodiment mode, irradiation with the laser beam 122 is performed in order to improve planarity. Thus, an increase in a temperature of the base substrate 101 can be suppressed as compared to the case of planarization by heat treatment. That is, a substrate with low resistance against heat, such as a glass substrate, can be used as the base substrate 101. Note that melting of the semiconductor layer 115 by irradiation with the laser beam 122 is preferably partial melting. If the semiconductor layer 115 is completely melted, the semiconductor layer 115 is recrystallized due to disordered nucleation in the semiconductor layer 115 in a liquid phase, whereby crystallinity of the semiconductor layer 115 is lowered. By partial melting, crystal is grown from a solid phase portion which is not melted. Accordingly, defects of the semiconductor layer 115 are reduced and crystallinity is recovered. Note that "complete melting" means that the semiconductor layer 115 is melted to an interface with the bonding layer 114 and becomes a liquid state. On the other hand, "partial melting" means that an upper layer is melted and becomes a liquid phase but a lower layer is not melted and remains in a solid phase.

As a laser which oscillates the laser beam 122, a laser having an oscillation wavelength from an ultraviolet light region to a visible light region is selected. A wavelength of the laser beam 122 is needed to be a wavelength which is absorbed into the semiconductor layer 115. The wavelength can be determined in consideration of the skin depth of the laser beam and the like. For example, the wavelength can be in the range of greater than or equal to 250 nm and less than or equal to 700 nm.

As the above-described laser, a continuous wave laser, a quasi-continuous wave laser, or a pulsed laser can be used. It is preferable to use a pulsed laser for partial melting. For example, in the case of a pulsed laser, a repetition rate is less than or equal to 1 MHz, and a pulse width is greater than or equal to 10 nanoseconds and less than or equal to 500 nanoseconds. For example, a XeCl excimer laser with a repetition rate of 10 Hz to 300 Hz, a pulse width of 25 nanoseconds, and a wavelength of 308 nm can be used.

Further, the energy of the laser beam 122 can be determined in consideration of the wavelength of the laser beam 122, the skin depth of the laser beam 122, the thickness of the semiconductor layer 115, or the like. The irradiation energy density of the laser beam 122 can be, for example, in the range of greater than or equal to 300 mJ/cm$^2$ and less than or equal to 800 mJ/cm$^2$. For example, in the case where the thickness of the semiconductor layer 115 is approximately 120 nm, a pulsed laser is used for a laser, and the wavelength of the laser beam 122 is 308 nm, the irradiation energy density of the laser beam 122 can be 600 mJ/cm$^2$ to 700 mJ/cm$^2$.

Irradiation with the laser beam 122 is preferably performed in an inert atmosphere such as a rare gas atmosphere or a nitrogen atmosphere, or in a vacuum state. To perform irradiation with the laser beam 122 in an inert atmosphere, an atmosphere in a chamber with an airtight structure may be controlled, and irradiation with the laser beam 122 may be performed in the chamber. In the case of using no chamber, for example, an inert gas such as a nitrogen gas is sprayed on a surface to be irradiated with the laser beam 122, whereby irradiation with the laser beam 122 in an inert atmosphere can be realized. An inert atmosphere or a vacuum state is more effective in improving planarity than an atmospheric atmosphere. In addition, the inert atmosphere or the vacuum state is more effective in suppressing generation of cracks and ridges than the atmospheric atmosphere; therefore, these atmospheres are preferable.

As the laser beam 122, a laser beam of which energy distribution is made uniform using an optical system and of which a cross-sectional shape is made linear, is preferably used. Thus, irradiation with the laser beam 122 can be performed with high throughput, and irradiation with the laser beam 122 can be performed uniformly. The beam length of the laser beam 122 is made longer than a side of the base substrate 101, whereby all the semiconductor layers 115 which are bonded to the base substrate 101 can be irradiated with the laser beam 122 by one-time scanning. In the case where the beam length of the laser beam 122 is shorter than a side of the base substrate 101, a beam length such that all the semiconductor layers 115 which are bonded to the base substrate 101 can be irradiated with the laser beam 122 by plural-time scanning may be selected.

Note that before the semiconductor layers 115 are irradiated with the laser beam 122, treatment in which an oxide film such as a natural oxide film formed over a surface of the semiconductor layer 115 is removed, may be performed. The oxide film is removed in advance because an effect of planarization can not be sufficiently obtained even if irradiation with the laser beam 122 is performed with the oxide film left over the surface of the semiconductor layer 115. Treatment of removing the oxide film can be performed using hydrofluoric acid. Treatment using hydrofluoric acid is desirably performed to the extent that the surface of the semiconductor layer 115 exhibits water repellency because removal of the oxide film from the semiconductor layer 115 can be confirmed from the semiconductor layer 115 which is made to exhibit water repellency.

A process for irradiation with the laser beam 122 shown in FIG. 10B can be carried out in the following manner, for example. First, the semiconductor layer 115 is treated for 110 seconds with hydrofluoric acid which is diluted 100-fold, whereby the superficial oxide film is removed. As a laser of the laser beam 122, a XeCl excimer laser (wavelength: 308 nm, pulse width: 25 nanoseconds, and repetition rate: 60 Hz) is used. With the optical system, shaping is performed so that the cross section of the laser beam 122 is made into a linear shape of 300 mm×0.34 mm. The semiconductor layers 115 are irradiated with the laser beam 122 in such a manner that the scanning rate of the laser beam 122 is set to 2.0 mm/second, the scanning pitch is set to 33 μm, and the number of beam shots is set to approximately 10 shots. The laser beam 122 is scanned with a nitrogen gas sprayed on the irradiated surface. In the case where the base substrate 101 has a size of 730 mm×920 mm, the laser beam 122 is scanned three times, whereby all the semiconductor layers 115 which are bonded to the base substrate 101 can be irradiated with the laser beam 122.

After irradiation with the laser beam 122, the single crystal semiconductor layers 116 are subjected to etching treatment or etch-back treatment. The etching treatment (or etch-back treatment) is treatment for optimizing a thickness in manufacturing a semiconductor device. Of course, the treatment may be omitted in the case where a desired film thickness (for example, 30 nm to 80 nm) is obtained in etching treatment (or etch-back treatment) performed before laser beam irradiation or in laser beam irradiation treatment. Further, when contamination of the surface of the semiconductor layer becomes a problem in the case of transferring a semiconductor substrate as it is (in the case of distributing a semiconductor substrate to the market), the treatment may be omitted to have a margin of a film thickness of a semiconductor layer, and the surface may be treated at a stage of manufacturing a semiconductor device.

The condition of the etching treatment or etch-back treatment is similar to that of the etching treatment or etch-back treatment performed before laser beam irradiation; therefore, the details are omitted here.

After that, heat treatment at a temperature of higher than or equal to 500° C. and lower than or equal to 650° C. is preferably performed on the single crystal semiconductor layers 116. By the heat treatment, defects of the single crystal semiconductor layers 116 which are not recovered by irradiation with the laser beam 122 can be eliminated, and distortion of the single crystal semiconductor layers 116 can be relieved. For the heat treatment, a rapid thermal anneal (RTA) apparatus, a resistance heating furnace, a microwave heating apparatus, or the like can be used. In the case of using, for example, a resistance heating furnace, heating may be performed at 500° C. for one hour, then, heating may be performed at 550° C. for four hours.

Through the above-described processes, the semiconductor substrate 100 shown in FIG. 1 and FIG. 10C can be manufactured. According to this embodiment mode, the insulating layers 112, the damaged regions 113, and the bonding layers 114 can be collectively provided for the plurality of single crystal semiconductor substrates 110 arranged in the tray 10. Thus, the semiconductor substrate 100 can be formed with high throughput. Further, since the single crystal semiconductor substrates 110 are bonded to the base substrate 101 while being arranged in the tray 10, the plurality of single crystal semiconductor substrates 110 can be easily bonded to the base substrate 101 with high throughput.

Further, by subjecting the surface of the base substrate 101 to etching treatment to provide the depression 118, bending stress applied to a region where a bond is formed can be relieved, and the single crystal semiconductor layer 116 can be prevented from being separated from the base substrate 101. That is, reliability of the semiconductor substrate 100 can be drastically improved. Further, even when an impurity due to a composition of the base substrate 101 or an abrasive used for polishing the surface of the base substrate 101 is present at the surface and the vicinity of the base substrate 101, deterioration of characteristics of a semiconductor device which is caused by intrusion of the impurity or abrasive into the single crystal semiconductor layer 116 can be prevented. Further, the depression 118 included in the base substrate 101 has the advantage that division can be favorably performed when the semiconductor devices are divided.

Note that the single crystal semiconductor substrates 110 are not transferred to another tray 10 in the processes shown in FIGS. 7A to 7C; however, in each process, the single crystal semiconductor substrates 110 may be transferred to a tray 10 dedicated to an apparatus used in the process. For example, a tray 10 dedicated to a PECVD apparatus can be used in the process of forming the insulating layer 112 of FIG. 7A, and a tray 10 dedicated to a doping apparatus can be used in the process of FIG. 7C.

Further, after the process for forming the insulating layer 112 of FIG. 7A, the single crystal semiconductor substrates 110 provided with the insulating layers 112 can be extracted from the tray 10, cleaning treatment such as an ultrasonic cleaning can be performed on the single crystal semiconductor substrates 110, and the single crystal semiconductor substrates 110 can be arranged in another tray 10 which is clean.

Furthermore, after the process for forming the damaged regions 113 of FIG. 7B, the single crystal semiconductor substrates 110 provided with the damaged regions 113 can be taken out from the tray 10, cleaning treatment such as an ultrasonic cleaning can be performed on the single crystal semiconductor substrates 110, and the single crystal semiconductor substrates 110 can be arranged in another tray 10 which is clean.

Note that although this embodiment mode describes a mode in which etching treatment or etch-back treatment is performed before and after laser beam irradiation, the present invention is not construed as being limited thereto. A mode in which etching treatment or etch-back treatment is performed only before laser beam irradiation or only after laser beam irradiation can be used. Further, a mode in which heat treatment is performed instead of laser beam irradiation may be used. In this case, etching treatment or etch-back treatment may be performed at least before heat treatment or after heat treatment. Of course, a mode in which heat treatment and laser beam irradiation are concurrently performed may be used. By concurrently performing heat treatment and laser beam irradiation, an effect similar to that produced in the case of using only one of the heat treatment and laser beam irradiation can be obtained at a lower temperature or with a smaller number of shots than the case of using only one of the heat treatment and laser beam irradiation. Note that heat temperature is set to be lower than or equal to the upper temperature limit of the base substrate.

Embodiment Mode 2

This embodiment mode describes reprocessing of a single crystal semiconductor substrate. In specific, the case where the single crystal semiconductor substrates 117 shown in FIG. 8B are reprocessed is described with reference to FIGS. 11A to 11D.

After the process of FIG. 8B, a projection 117a is formed in the periphery of the single crystal semiconductor substrate 117 as shown in FIGS. 11A to 11D, and an insulating film 112a, an insulating film 112b, and a bonding layer 114 are left over the projection 117a.

Figure 11A:
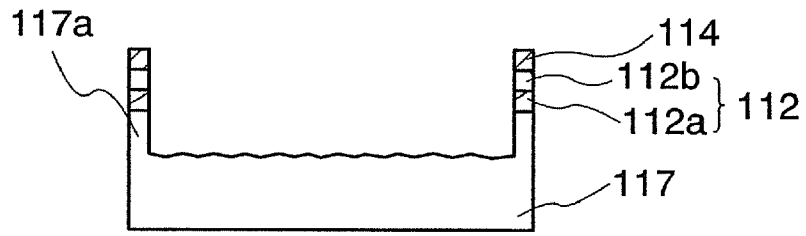
FIGS. 11A to 11D are diagrams showing reprocessing of a single crystal semiconductor substrate.
Figure 11B:
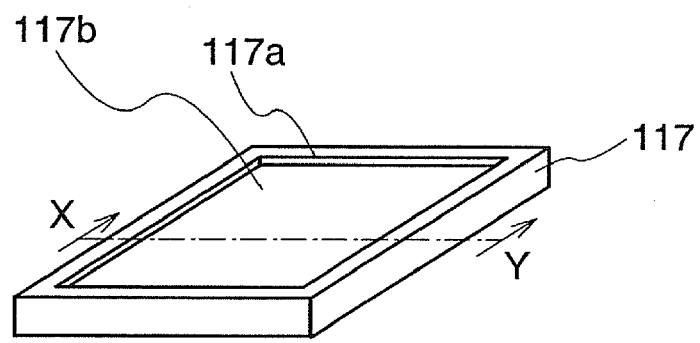
Figure 11C:
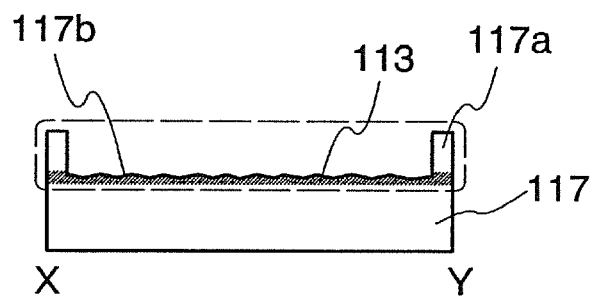

First, etching treatment by which the insulating film 112b, the insulating film 112a, and the bonding layer 114 are removed is performed. When these films and the layer are formed from silicon oxide, silicon oxynitride, or silicon nitride oxide, wet etching treatment using hydrofluoric acid may be performed, for example. By the etching treatment, a single crystal semiconductor substrate 117 as shown in FIG. 11B is obtained. FIG. 11C is a cross-sectional view taken along a long dashed short dashed line X-Y of FIG. 11B.

Next, the single crystal semiconductor substrate 117 shown in FIGS. 11B and 11C is subjected to etching treatment, whereby the projection 117a and a separation surface 117b are removed. A portion surrounded by a dashed line, which is shown in FIG. 11C, is a portion to be removed by the etching treatment. By the etching, a damaged region 113 which is left in the single crystal semiconductor substrate 117 is removed. As the etching treatment which is performed on the single crystal semiconductor substrate 117, wet etching treatment is preferable. As etchant, a tetramethylammonium hydroxide (abbreviation: TMAH) solution can be used.

Figure 11D:
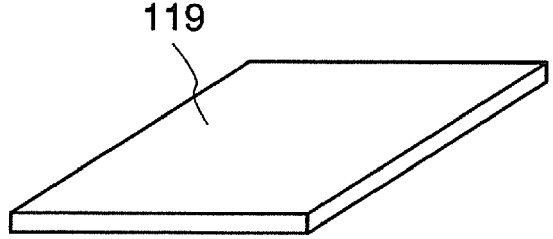

The single crystal semiconductor substrate 117 is subjected to the etching treatment, whereby the projection 117a, the separation surface 117b, and the damaged region 113 are removed. Then, a surface of the single crystal semiconductor substrate 117 is mechanically polished; thus, a single crystal semiconductor substrate 119 having a smooth surface as shown in FIG. 11D is formed. The single crystal semiconductor substrate 119 can be reused as the single crystal semiconductor substrate 110 shown in FIG. 2.

For the polishing treatment, chemical mechanical polishing (abbreviation: CMP) can be used. To smooth a surface of the single crystal semiconductor substrate 119, the surface is desirably polished by approximately greater than or equal to 1 μm and less than or equal to 10 μm in thickness. After the polishing, cleaning with hydrofluoric acid or RCA cleaning is performed because abrasive particles or the like are left over a surface of the single crystal semiconductor substrate 119.

As described in this embodiment mode, a single crystal semiconductor substrate is reused, whereby a cost for a material of the semiconductor substrate 100 can be reduced.

This embodiment mode can be used in combination with Embodiment Mode 1.

Embodiment Mode 3

This embodiment mode describes a method for manufacturing a thin film transistor as an example of a method for manufacturing a semiconductor device using a semiconductor substrate 100. By combining a plurality of thin film transistors, various semiconductor devices are formed. In this embodiment mode, the semiconductor substrate 100 manufactured by the manufacturing method of Embodiment Mode 1 is used.

Figure 12A:
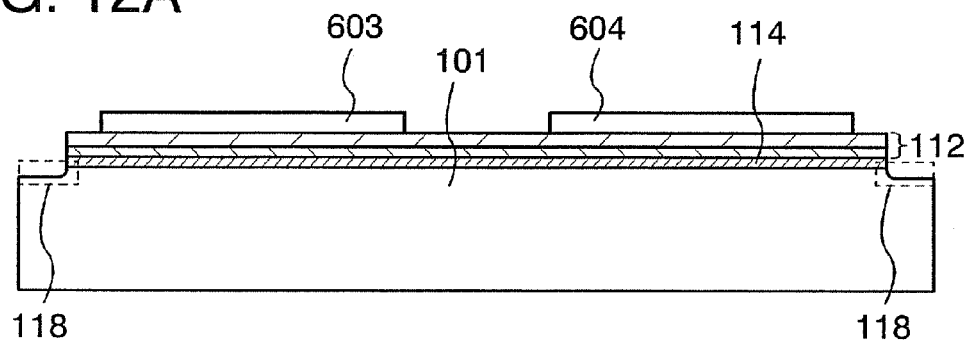
FIGS. 12A to 12D are cross-sectional views showing a method for manufacturing a semiconductor device.

First, as shown in FIG. 12A, a single crystal semiconductor layer 116 over the base substrate 101 is processed (patterned) into a desired shape by etching; thus, a semiconductor film 603 and a semiconductor film 604 are formed. Note that the base substrate 101 has a depression 118.

To the semiconductor films 603 and 604, a p-type impurity such as boron, aluminum, or gallium, or an n-type impurity such as phosphorus or arsenic may be added in order to control a threshold voltage. For example, in the case of adding boron as an impurity imparting p-type conductivity, boron may be added at a concentration of $5\times10^{16}$ cm$^{-3}$ to $1\times10^{17}$ cm$^{-3}$ inclusive. The addition of an impurity for controlling a threshold voltage may be performed on the single crystal semiconductor layer 116 or may be performed on the semiconductor films 603 and 604. The addition of an impurity for controlling a threshold voltage may be performed on a single crystal semiconductor substrate 110. Alternatively, the addition of an impurity may be performed on the single crystal semiconductor substrate 110 in order to roughly control a threshold voltage, and the addition of an impurity may be further performed on the single crystal semiconductor layer 116 or the semiconductor films 603 and 604 in order to finely control a threshold voltage.

Moreover, hydrogenation treatment may be performed after forming the semiconductor films 603 and 604 and before forming gate insulating films 606. The hydrogenation is performed, for example, at 350° C. in a hydrogen atmosphere for about 2 hours.

Figure 12B:
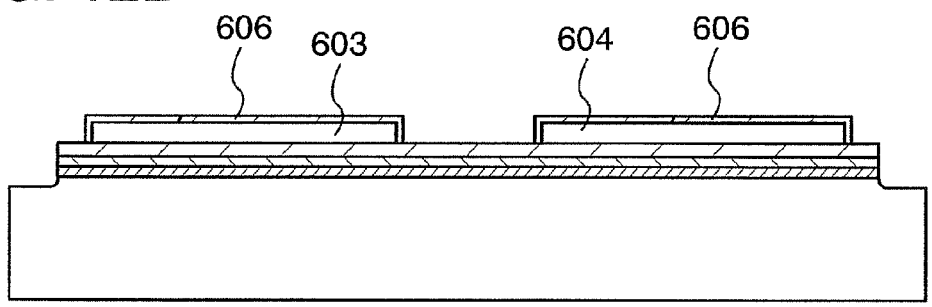

Next, as shown in FIG. 12B, the gate insulating films 606 are formed to cover the semiconductor films 603 and 604. Surfaces of the semiconductor films 603 and 604 may be oxidized or nitrided by high-density plasma treatment, whereby the gate insulating films 606 can be formed. High-density plasma treatment is performed by using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. By such high-density plasma, the surfaces of the semiconductor films are oxidized or nitrided by oxygen radicals (OH radicals may be included) or nitrogen radicals (NH radicals may be included) which are produced, whereby each insulating film is formed to a thickness of greater than or equal to 1 nm and less than or equal to 20 nm, desirably greater than or equal to 2 nm and less than or equal to 10 nm so as to be in contact with the semiconductor films.

Since the oxidation or nitridation of the semiconductor films by the high-density plasma treatment proceeds by a solid-phase reaction, the interface state density between the gate insulating film 606 and each of the semiconductor films 603 and 604 can be drastically decreased. Further, the semiconductor films are directly oxidized or nitrided by the high-density plasma treatment, whereby variation in thickness of the insulating films to be formed can be suppressed. Since the semiconductor films have crystallinity, even when surfaces of the semiconductor films are oxidized by a solid-phase reaction by using the high-density plasma treatment, nonuniform oxidation in a crystal grain boundary can be prevented; thus, a gate insulating film with good uniformity and low interface state density can be formed. When an insulating film formed by high-density plasma treatment as described above is used for part of or the entire gate insulating film of a transistor, variation in characteristic of transistors can be suppressed.

As a more specific example, surfaces of the semiconductor films 603 and 604 are oxidized or nitrided in such a manner that nitrous oxide (N$_2$O) is diluted 1- to 3-fold (the flow ratio) with argon (Ar) and microwave power (2.45 GHz) of greater than or equal to 3 kW and less than or equal to 5 kW is applied under pressure of greater than or equal to 10 Pa and less than or equal to 30 Pa. By this treatment, a lower layer of the gate insulating film 606 with a thickness of greater than or equal to 1 nm and less than or equal to 10 nm (preferably, greater than or equal to 2 nm and less than or equal to 6 nm) is formed. Further, a silicon oxynitride film is formed as an upper layer of the gate insulating film 606 by a vapor-phase growth method in such a manner that nitrous oxide (N$_2$O) and silane (SiH$_4$) are introduced and microwave power (2.45 GHz) of greater than or equal to 3 kW and less than or equal to 5 kW is applied under pressure of greater than or equal to 10 Pa and less than or equal to 30 Pa. The gate insulating film 606 is formed by combining solid phase reaction and reaction by a vapor-phase growth method as described above, whereby the gate insulating film 606 with low interface state density and excellent dielectric strength can be formed. Note that FIG. 12B shows a case where the gate insulating film 606 has a single-layer structure formed by solid-phase growth; on the other hand, in the case of forming the gate insulating film 606 by combining solid phase reaction and reaction by a vapor-phase growth method as in the specific example described above, the gate insulating film 606 has a two-layer structure.

Alternatively, the gate insulating films 606 may be formed by thermally oxidizing the semiconductor films 603 and 604. In the case of forming the gate insulating films 606 by such thermal oxidation, a base substrate with a comparatively high resistance against heat is preferably used.

Further alternatively, the gate insulating film 606 may be formed by forming a film including silicon oxide, silicon nitride oxide, silicon nitride, hafnium oxide, aluminum oxide, tantalum oxide, or the like by a plasma CVD method, a sputtering method, or the like to have a single-layer structure or a stacked-layer structure.

Still further alternatively, hydrogen included in the gate insulating film 606 may be dispersed in the semiconductor films 603 and 604 by performing heat treatment at a temperature of higher than or equal to 350° C. and lower than or equal to 450° C. after the gate insulating film 606 including hydrogen is formed. In this case, the gate insulating film 606 may be formed by depositing silicon nitride or silicon nitride oxide by a plasma CVD method. Further, in this case, a process temperature is set to less than or equal to 350° C. In this manner, hydrogen is supplied to the semiconductor films 603 and 604, whereby defects in the semiconductor films 603 and 604, at an interface between the gate insulating film 606 and the semiconductor film 603, and at an interface between the gate insulating film 606 and the semiconductor film 604 can be effectively reduced.

Figure 12C:
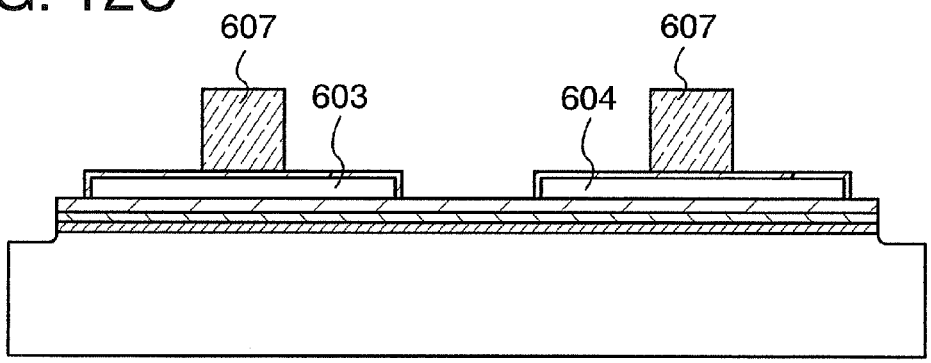

Next, as shown in FIG. 12C, a conductive film is formed over the gate insulating films 606, and then, the conductive film is processed (patterned) into a predetermined shape, whereby electrodes 607 are formed over the semiconductor films 603 and 604. The conductive film can be formed by a CVD method, a sputtering method, or the like. The conductive film can be formed from a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as its main component or a compound containing the above-described metal can also be used. Further alternatively, a semiconductor material such as polycrystalline silicon, which is obtained by doping a semiconductor film with an impurity element that imparts conductivity, or the like may be used.

Although each of the electrodes 607 is formed of a single-layer conductive film in this embodiment mode, the semiconductor device of the present invention is not limited to the structure. Each of the electrodes 607 may be formed of plural conductive films which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that as masks used for forming the electrodes 607, silicon oxide, silicon nitride oxide, or the like may be used instead of a resist material. In this case, a process for forming a mask by patterning a silicon oxide film, a silicon oxynitride film, or the like is additionally needed; however, the amount of the reduced film thickness of the mask in etching is smaller than the resist material; thus, the electrode 607 with an accurate shape can be formed. Alternatively, the electrodes 607 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrode 607 can be formed in such a manner that an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate, so that the conductive film is etched so as to obtain a desired tapered shape. The tapered shape can be adjusted by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 12D:
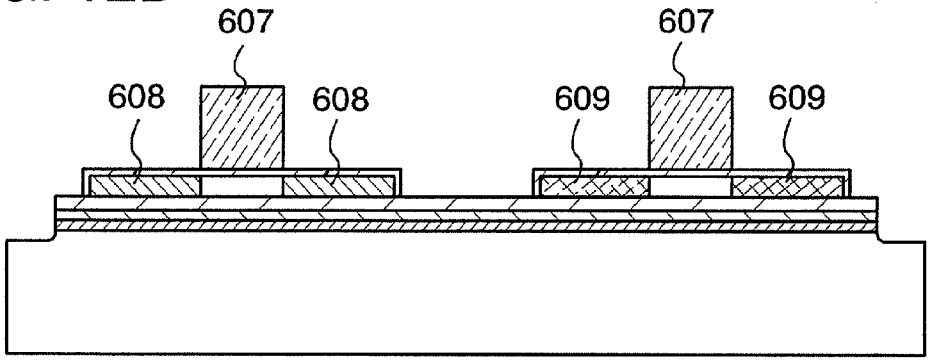

Next, as shown in FIG. 12D, an impurity element imparting one conductivity type is added to the semiconductor films 603 and 604 with the electrodes 607 used as masks. In this embodiment mode, an impurity element imparting n-type conductivity (for example, phosphorus or arsenic) is added to the semiconductor film 603, and an impurity element imparting p-type conductivity (for example, boron) is added to the semiconductor film 604. Note that when the impurity element imparting n-type conductivity is added to the semiconductor film 603, the semiconductor film 604 to which the p-type impurity element is added is covered with a mask or the like so that the impurity element imparting n-type conductivity is added selectively. Further, when the impurity element imparting p-type conductivity is added to the semiconductor film 604, the semiconductor film 603 to which the n-type impurity element is added is covered with a mask or the like so that the impurity element imparting p-type conductivity is added selectively. Alternatively, after an impurity element imparting one of p-type and n-type conductivities is added to the semiconductor films 603 and 604, an impurity element imparting the other conductivity may be added to only one of the semiconductor films so as to form higher concentration regions. By the addition of the impurity, impurity regions 608 are formed in the semiconductor film 603 and impurity regions 609 are formed in the semiconductor film 604.

Figure 13A:
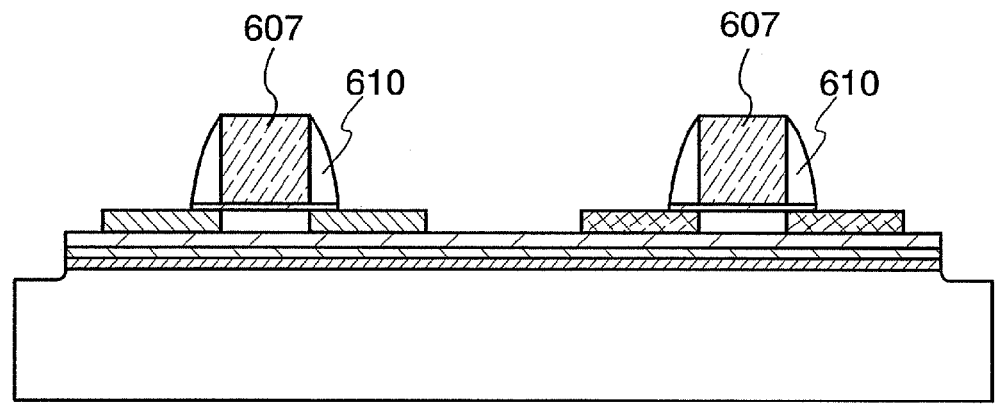
FIGS. 13A to 13C are cross-sectional views showing a method for manufacturing a semiconductor device.

Subsequently, as shown in FIG. 13A, sidewalls 610 are formed on side surfaces of the electrodes 607. The sidewalls 610 can be formed by, for example, newly forming an insulating film so as to cover the gate insulating film 606 and the electrodes 607 and by partially etching the insulating film by anisotropic etching mainly in a perpendicular direction. Note that the gate insulating films 606 may also be etched partially by the above-described anisotropic etching. As the insulating film for forming the sidewalls 610, a film including silicon, silicon oxide, silicon nitride, silicon oxynitride, silicon nitride oxide, an organic material, or the like may be formed to have a single-layer structure or a stacked-layer structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the process for forming the sidewalls 610 is not limited to these steps.

Figure 13B:
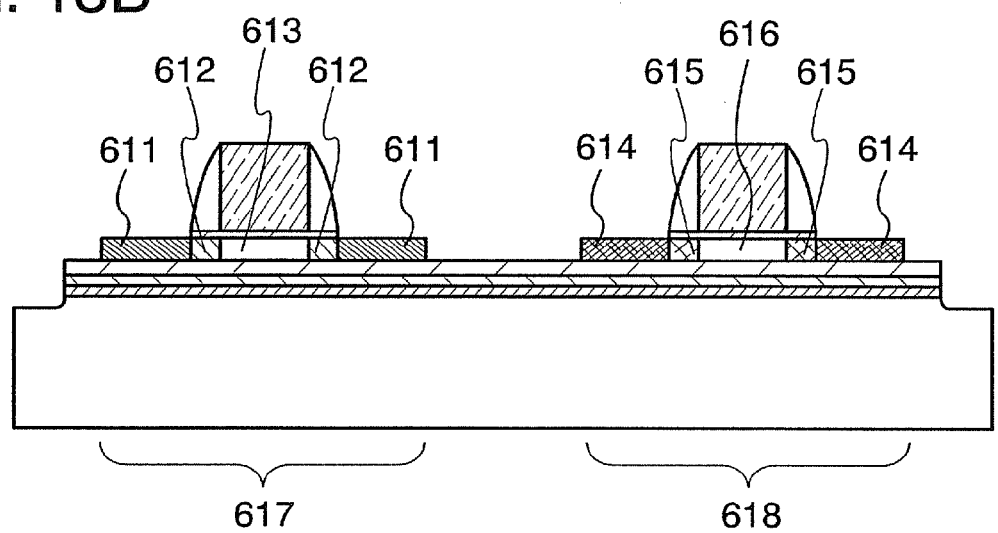

Next, as shown in FIG. 13B, an impurity element imparting one conductivity type is added to the semiconductor films 603 and 604 with the electrodes 607 and the sidewalls 610 used as masks. Note that the impurity element imparting the same conductivity type as the impurity element which has been added to the semiconductor films 603 and 604 in the previous process are added to the semiconductor films 603 and 604 to form higher concentration regions. Note that when the impurity element imparting n-type conductivity is added to the semiconductor film 603, the semiconductor film 604 to which the p-type impurity element is added is covered with a mask or the like so that the impurity element imparting n-type conductivity is added selectively. Alternatively, when the impurity element imparting p-type conductivity is added to the semiconductor film 604, the semiconductor film 603 to which the n-type impurity element is added is covered with a mask or the like so that the impurity element imparting p-type conductivity is added selectively.

By the above-described addition of the impurity element, a pair of high-concentration impurity regions 611, a pair of low-concentration impurity regions 612, and a channel formation region 613 are formed in the semiconductor film 603. In addition, by the above-described addition of the impurity element, a pair of high-concentration impurity regions 614, a pair of low-concentration impurity regions 615, and a channel formation region 616 are formed in the semiconductor film 604. The high-concentration impurity regions 611 and 614 function as sources and drains, and the low-concentration impurity regions 612 and 615 function as LDD (lightly doped drain) regions.

Note that the sidewalls 610 formed over the semiconductor film 604 and the sidewalls 610 formed over the semiconductor film 603 may be formed so as to have the same width in the carrier flow direction (that is, a direction parallel to a channel length), or may be formed so as to have different widths. It is preferable that the width of each sidewall 610 over the semiconductor film 604 which constitutes a part of a p-channel transistor be larger than the width of each sidewall 610 over the semiconductor film 603 which constitutes a part of an n-channel transistor. This is because boron which is added for forming a source and a drain in the p-type transistor is easily diffused and a short channel effect is easily induced. By increasing the widths of the sidewalls 610 of the p-type transistor, boron can be added to the source and the drain of high concentration regions, whereby the source and the drain can be made to have a lower resistance.

A silicide layer in which silicide is formed in part of the semiconductor films 603 and 604 may be formed in order to further reduce the resistance of the source and the drain. The silicide is formed by placing metal in contact with the semiconductor films and causing reaction between the metal and silicon in the semiconductor films by heat treatment (for example, a GRTA method, an LRTA method, or the like). The silicide layer may be formed from cobalt silicide or nickel silicide. In the case where the semiconductor films 603 and 604 are thin, silicide reaction may proceed to bottoms of the semiconductor films 603 and 604. As a metal material used for forming silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can be formed by laser beam irradiation or the like.

Through the aforementioned processes, an n-channel transistor 617 and a p-channel transistor 618 are formed. Note that although conductive films serving as source electrodes or drain electrodes are not formed in a stage shown in FIG. 13B, a structure including these conductive films may be referred to as a transistor.

Figure 13C:
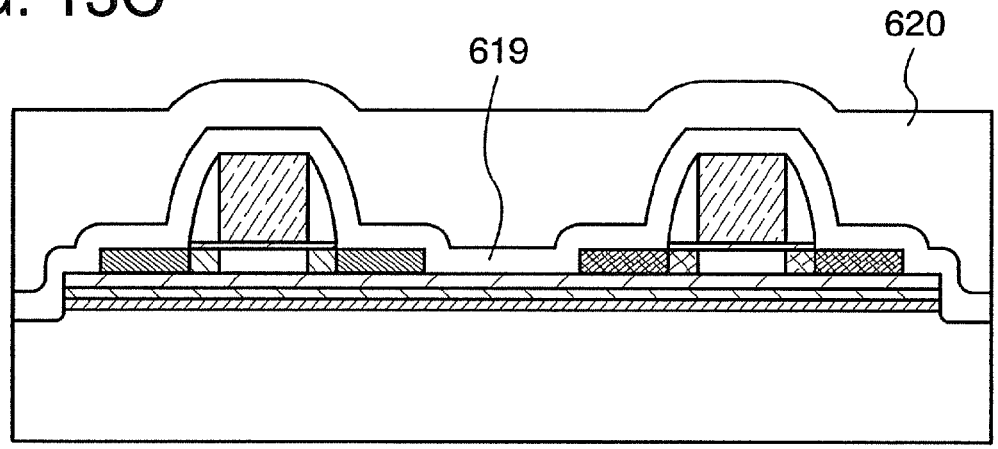

Next, as shown in FIG. 13C, an insulating film 619 is formed to cover the n-channel transistor 617 and the p-channel transistor 618. The insulating film 619 is not always necessary; however, the formation of the insulating film 619 can prevent impurities such as alkali metal or alkaline-earth metal from penetrating the n-channel transistor 617 and the p-channel transistor 618. In specific, the insulating film 619 is desirably formed from a material such as silicon oxide, silicon nitride, silicon oxynitride, silicon nitride oxide, aluminum nitride, aluminum oxide, or the like. In this embodiment mode, the insulating film 619 is formed of a silicon nitride oxide film with a thickness of about 600 nm. In this case, the above-described hydrogenation process may be performed after the silicon nitride oxide film is formed. Note that although the insulating film 619 is formed to have a single-layer structure in this embodiment mode, it is needless to say that the insulating film 619 may have a stacked-layer structure. For example, in the case of a two-layer structure, the insulating film 619 may have a stacked-layer structure of a silicon oxynitride film and a silicon nitride oxide film.

Owing to the insulating film 619, an insulating layer serving as a barrier layer is provided over the depression 118. Accordingly, a region where the base substrate 101 is exposed can be precluded. Thus, an impurity element from the base substrate 101 can be prevented from being diffused in the semiconductor layer or the like. That is, deterioration of a semiconductor device can be reduced, and a highly reliable semiconductor device can be provided.

Next, an insulating film 620 is formed over the insulating film 619 so as to cover the n-channel transistor 617 and the p-channel transistor 618. The insulating film 620 may be formed from an organic material having resistance against heat, such as polyimide, acrylic, benzocyclobutene, polyamide, or epoxy. As an alternative to the organic materials listed above, a low-dielectric, constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like may be used. Here, the siloxane-based resin corresponds to a resin including a Si—O—Si bond which is formed using a siloxane-based material as a starting material. The siloxane-based resin may include at least any one of hydrogen, fluorine, an alkyl group, and aromatic hydrocarbon as a substituent. Alternatively, the insulating film 620 may be formed by stacking plural insulating films formed of any of these materials. Further, the insulating film 620 may be planarized by a CMP method or the like.

For the formation of the insulating film 620, the following method can be used depending on the material of the insulating film 620: a CVD method, a sputtering method, an SOG method, a spin coating method, a dip coating method, a spray coating method, a droplet discharge method (e.g., an ink-jet method, screen printing, or offset printing), a doctor knife, a roll coater, a curtain coater, a knife coater, or the like.

Figure 14A:
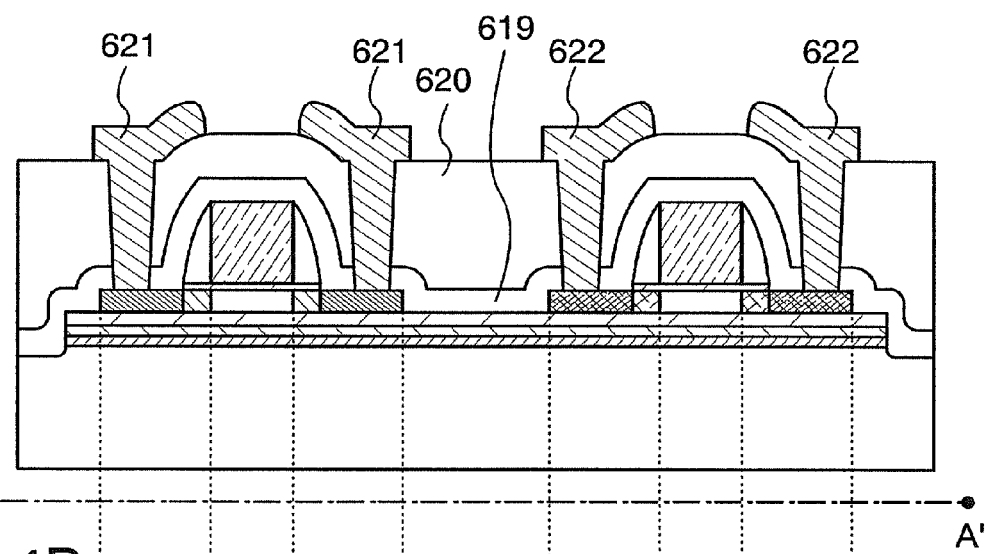
FIGS. 14A and 14B are a cross-sectional view and a plan view, respectively, which show an example of a semiconductor device.

Next, contact holes are formed in the insulating films 619 and 620 so that each of the semiconductor films 603 and 604 is partially exposed. Then, as shown in FIG. 14A, conductive films 621 and 622 are formed to be in contact with the semiconductor films 603 and 604, respectively, through the contact holes. The conductive films 621 and 622 serve as source and drain electrodes of the transistors. Note that in this embodiment mode, as an etching gas for forming the contact holes, a mixed gas of $CHF_3$ and He is employed; however, the etching gas is not limited thereto.

The conductive films 621 and 622 can be formed by a CVD method, a sputtering method, or the like. In specific, the conductive films 621 and 622 can be formed from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. The conductive films 621 and 622 may each have a single-layer structure or a stacked-layer structure.

As an example of an alloy containing aluminum as its main component, an alloy containing aluminum as its main component and also containing nickel is given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the conductive films 621 and 622. In particular, the aluminum silicon is preferable because a hillock can be prevented from generating in resist baking at the time of patterning. Further, a material in which Cu is mixed into aluminum at approximately 0.5% may be used instead of silicon.

In the case where each of the conductive films 621 and 622 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming conductive films so as to interpose an aluminum silicon film between the barrier films, generation of a hillock of aluminum or aluminum silicon can be further prevented. Moreover, by forming the barrier film using titanium that is a highly reducible element, even if a thin oxide film is formed over the semiconductor films 603 and 604, the oxide film is reduced by the titanium contained in the barrier film, whereby preferable contact between the conductive film 621 and the semiconductor film 603 and between the conductive film 622 and the semiconductor film 604 can be obtained. Further, it is also possible to stack a plurality of barrier films. In that case, for example, each of the conductive films 621 and 622 can be formed to have a five-layer structure including, for example, titanium, titanium nitride, aluminum silicon, titanium, and titanium nitride in this order from the bottom; or a stacked-layer structure including more than five layers.

For the conductive films 621 and 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and 622.

Note that the conductive film 621 is connected to the high-concentration impurity region 611 of the n-channel transistor 617. The conductive film 622 is connected to the high-concentration impurity region 614 of the p-channel transistor 618.

Figure 14B:
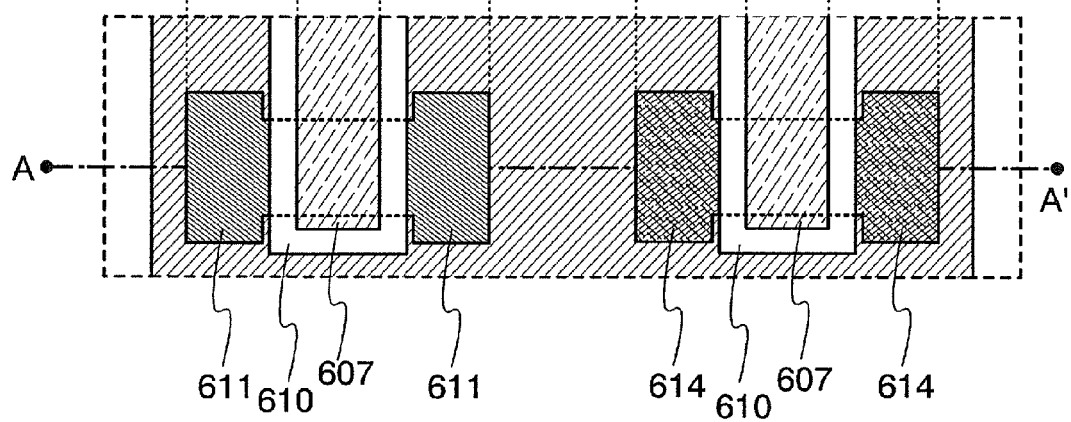

FIG. 14B shows a plan view of the n-channel transistor 617 and the p-channel transistor 618 which are shown in FIG. 14A. However, in FIG. 14B, the conductive film 621, the conductive film 622, the insulating film 619, and the insulating film 620 are omitted for simplicity.

Note that although this embodiment mode describes the case where each of the n-channel transistor 617 and the p-channel transistor 618 includes one electrode 607 serving as the gate electrode as an example, the present invention is not limited to this structure. The transistor manufactured in the present invention may have a multi-gate structure in which a plurality of electrodes serving as gate electrodes are included and electrically connected to one another.

Note that the semiconductor film included in the SOI substrate according to the present invention is extremely near to a single crystal. Therefore, as compared to the case of using a polycrystalline semiconductor film, variation in crystal orientation is small; thus, variation in threshold voltage of transistors can be made small. Further, unlike a polycrystalline semiconductor film, crystal grain boundary is hardly observed; accordingly, leakage current due to a crystal grain boundary can be suppressed, and thus, power saving of a semiconductor device can be realized. Furthermore, variation of transistors due to variation of the size of crystal grains can be suppressed.

In a polycrystalline semiconductor film obtained by laser crystallization, a ridge is easily generated on a surface of the semiconductor film due to a distribution of energy density in a beam spot. Meanwhile, a semiconductor film included in an SOI substrate may be irradiated with a laser beam with low energy density to the extent that defects in the semiconductor film caused by bonding can be repaired. Accordingly, a surface of the semiconductor film included in an SOI substrate can have extremely high planarity, and a thickness of a gate insulating film formed over the semiconductor film can be reduced to approximately 5 nm to 50 nm. Thus, a high ON current can be obtained while a gate voltage is kept low.

This embodiment mode can be used in combination with Embodiment Mode 1 or Embodiment Mode 2, as appropriate.

Embodiment Mode 4

This embodiment mode describes an example of a method for manufacturing a semiconductor device of the present invention, with reference to FIGS. 15A to 15D, FIGS. 16A to 16C, FIGS. 17A to 17C, and FIGS. 18A and 18B. Note that a liquid crystal display device is given as an example of a semiconductor device in this embodiment mode; however, a semiconductor device of the present invention is not limited to a liquid crystal display device.

Figure 15A:
FIGS. 15A to 15D are diagrams showing a manufacturing process of a semiconductor device of the present invention.

First, a single crystal semiconductor layer is formed over a substrate having an insulating surface by the method shown in Embodiment Mode 1, or the like (see FIG. 15A). Here, description is made using a structure in which an insulating layer 1504 including a bonding layer and a single crystal semiconductor layer 1506 are sequentially provided over a substrate 1500 having an insulating surface is described; however, the present invention is not limited thereto.

Next, the single crystal semiconductor layer 1506 and the insulating layer 1504 are patterned to have desired shapes, thereby forming island-shaped single crystal semiconductor layers. Note that as etching processing in patterning, either dry etching (plasma etching or the like) or wet etching can be used. For treating a large-area substrate, plasma etching is more suitable. As an etching gas, a fluorine-based gas or a chlorine-based gas such as $CF_4$, $NF_3$, $Cl_2$, or $BCl_3$ may be used, and an inert gas such as He or Ar may be added thereto as appropriate. Further, in the case of applying etching processing by atmospheric pressure discharge, local discharge processing can be realized, whereby etching can be performed without forming a mask layer over an entire surface of the substrate.

After the single crystal semiconductor layer 1506 and the insulating layer 1504 are patterned, a p-type impurity such as boron, aluminum, or gallium may be added in order to control a threshold voltage. For example, as a p-type impurity, boron can be added at a concentration greater than or equal to $5 \times 10^{16}$ cm$^{-3}$ and less than or equal to $1 \times 10^{18}$ cm$^{-3}$.

The insulating layer 1504 preferably has a barrier layer against an impurity element, in addition to the bonding layer. The barrier layer can be formed using a material such as silicon nitride or silicon nitride oxide. In the case of providing a barrier layer, a stacked-layer structure of a bonding layer, silicon nitride oxide, and silicon oxynitride from the side in contact with the substrate having an insulating surface can be used for the insulating layer 1504, for example. Instead of silicon nitride oxide, silicon nitride may be used. Further, instead of silicon oxynitride, silicon oxide may be used.

Figure 15B:
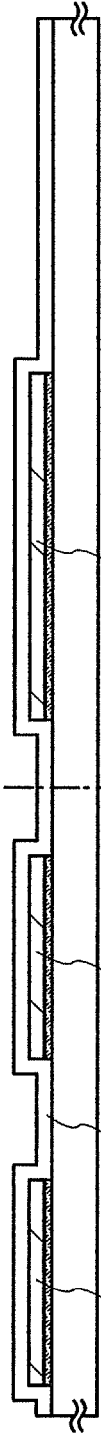
Figure 15C:
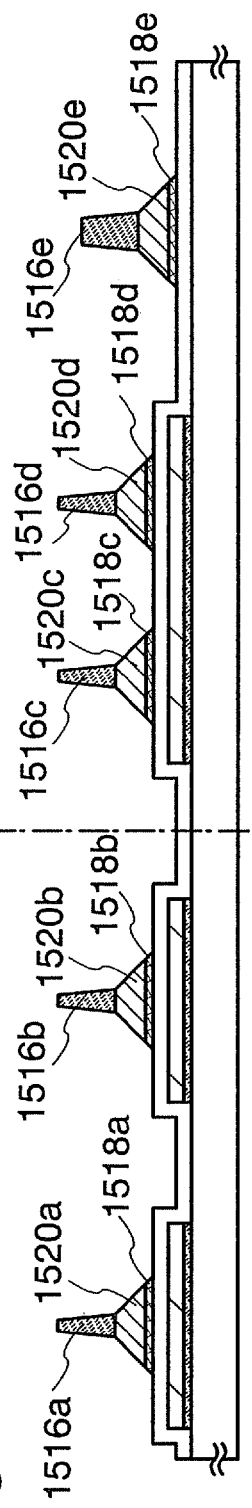

Next, a gate insulating layer 1508 which covers the island-shaped single crystal semiconductor layers is formed (see FIG. 15B). Note that for convenience, the island-shaped single crystal semiconductor layers which are formed by patterning are referred to as single crystal semiconductor layers 1510, 1512, and 1514 here. The gate insulating layer 1508 is formed of a silicon-containing insulating film by a plasma CVD method, a sputtering method, or the like, at a thickness of approximately greater than or equal to 10 nm and less than or equal to 150 nm. In specific, the gate insulating layer 1508 may be formed from a material such as an oxide material or a nitride material of silicon, which is typified by silicon nitride, silicon oxide, silicon oxynitride, and silicon nitride oxide. Note that the gate insulating layer 1508 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, more preferably greater than or equal to 2 nm and less than or equal to 5 nm may be formed between the single crystal semiconductor layer and the gate insulating layer. In order to form a gate insulating film having less leakage current at a low temperature, a rare gas element such as argon may be contained in a reaction gas.

Next, a first conductive film and a second conductive film, which serve as gate electrode layers, are stacked over the gate insulating layer 1508. The first conductive film may be formed at a thickness of about greater than or equal to 20 nm and less than or equal to 100 nm, and the second conductive film may be formed at a thickness of about greater than or equal to 100 nm and less than or equal to 400 nm. The first and second conductive films can be formed by a sputtering method, an evaporation method, a CVD method, or the like. The first and second conductive films may be formed of an element selected from tantalum, tungsten, titanium, molybdenum, aluminum, copper, chromium, neodymium, or the like; an alloy material or a compound material including any of those elements as its main component; or the like. Further, for the first and second conductive films, a semiconductor film typified by a polycrystalline silicon film doped with an impurity element such as phosphorus; an AgPdCu alloy; or the like may be used. Note that although a conductive layer with a two-layer structure is described in this embodiment mode, the present invention is not limited thereto. Alternatively, a three-layer structure or a single-layer structure may be employed.

Then, a photolithography method is used to form masks 1516a, 1516b, 1516c, 1516d, and 1516e from a resist material. Then, the first conductive film and the second conductive film are processed into a desired shape with the use of the masks to form first gate electrode layers 1518a, 1518b, 1518c, and 1518d, a first conductive layer 1518e, and conductive layers 1520a, 1520b, 1520c, 1520d, and 1520e (see FIG. 15C).

Here, an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate, whereby etching can be performed so as to obtain a desired tapered shape. An angle and the like of the tapered shape may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used for the etching gas, as appropriate. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Next, the conductive layers 1520a, 1520b, 1520c, 1520d, and 1520e are processed into a desired shape using the masks 1516a, 1516b, 1516c, 1516d, and 1516e. At this time, etching is performed under an etching condition in which the selectivity of the second conductive film, which forms the conductive layers, to the first conductive film, which forms the first gate electrode layers and the first conductive layer, is high. By the etching, second gate electrode layers 1522a, 1522b, 1522c, and 1522d, and a second conductive layer 1522e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Here, a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that in this embodiment mode, $Cl_2$, $SF_6$, and $O_2$ are used as an etching gas for forming the second gate electrode layers and the second conductive layer.

Figure 15D:
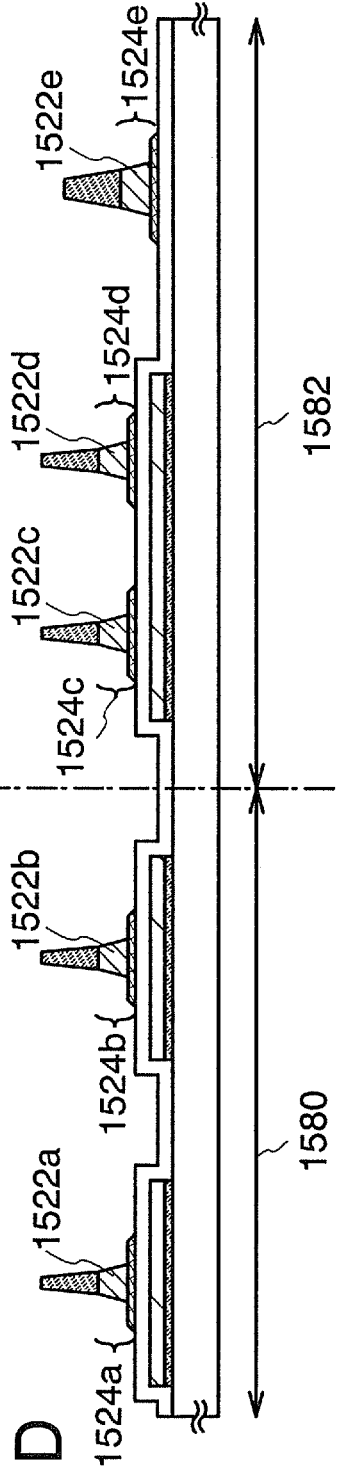

Through the aforementioned processes, gate electrode layers 1524a and 1524b can be formed in a peripheral driver circuit region 1580, and gate electrode layers 1524c and 1524d and a conductive layer 1524e can be formed in a pixel region 1582 (see FIG. 15D). Note that the masks 1516a, 1516b, 1516c, 1516d, and 1516e are removed after the aforementioned processes.

Next, an impurity element imparting n-type conductivity is added using the gate electrode layers 1524a, 1524b, 1524c, and 1524d as masks, thereby forming first n-type impurity regions 1526a, 1526b, 1528a, 1528b, 1530a, 1530b, and 1530c (see FIG. 16A). In this embodiment mode, doping is performed by using phosphine ($PH_3$) as a doping gas containing an impurity element. Here, doping is performed so that phosphorus (P) that is an impurity element imparting n-type conductivity is contained in the first n-type impurity regions at a concentration of approximately greater than or equal to $1 \times 10^{16}/cm^3$ and less than or equal to $5 \times 10^{19}/cm^3$.

Next, masks 1532a, 1532b, and 1532c which cover the single crystal semiconductor layer 1510 and part of the single crystal semiconductor layer 1514 are formed. An impurity element imparting n-type conductivity is added using the masks 1532a, 1532b, and 1532c, and the second gate electrode layer 1522b as masks. Accordingly, second n-type impurity regions 1534a and 1534b; third n-type impurity regions 1536a and 1536b; second n-type impurity regions 1540a, 1540b, and 1540c; and third n-type impurity regions 1542a, 1542b, 1542c, and 1542d are formed. In this embodiment mode, doping is performed by using phosphine ($PH_3$) as a doping gas containing an impurity element. Here, doping is performed so that phosphorus (P) that is an impurity element imparting n-type conductivity is contained in the second n-type impurity regions at a concentration of approximately greater than or equal to $1 \times 10^{17}/cm^3$ and less than or equal to $1 \times 10^{21}/cm^3$. An impurity element which imparts n-type conductivity is added to the third n-type impurity regions 1536a and 1536b so as to contain the impurity element imparting n-type conductivity at a concentration which is the same as or substantially the same as or at a slightly higher concentration than that of the third n-type impurity regions 1542a, 1542b, 1542c, and 1542d. In addition, channel formation regions 1538, 1544a, and 1544b are formed (see FIG. 16B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1536a and 1536b is formed in a region overlapping with the first gate electrode layer 1518b. Accordingly, an electric field in the vicinity of a source or a drain can be relieved, and deterioration of on-state current due to hot carriers can be prevented. On the other hand, each of the third n-type impurity regions 1542a, 1542b, 1542c, and 1542d does not overlap with the gate electrode layer 1524c or 1524d; thus, an effect of reducing off-state current can be obtained.

Next, the masks 1532a, 1532b, and 1532c are removed, and masks 1546a and 1546b which cover the single crystal semiconductor layers 1512 and 1514 are formed. An impurity element imparting p-type conductivity is added using the masks 1546a and 1546b and the gate electrode layer 1524a as masks. Accordingly, first p-type impurity regions 1548a and 1548b, and second p-type impurity regions 1550a and 1550b are formed. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1 \times 10^{18}/cm^3$ and less than or equal to $5 \times 10^{21}/cm^3$. Further, a channel formation region 1552 is formed (see FIG. 16C).

Each of the first p-type impurity regions is a high-concentration impurity region and functions as a source or a drain. On the other hand, each of the second p-type impurity regions is a low-concentration impurity region and functions as a so-called LDD (lightly doped drain) region.

Subsequently, the masks 1546a and 1546b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser light irradiation, or the like may be performed to activate the impurity elements.

Subsequently, an interlayer insulating layer which covers the gate electrode layers and the gate insulating layer is formed. In this embodiment mode, a stacked-layer structure of insulating films 1554 and 1556 is employed (see FIG. 17A). A silicon nitride oxide film is formed as the insulating film 1554 with a thickness of 100 nm and a silicon oxynitride film is formed as the insulating film 1556 with a thickness of 900 nm. Although the two-layer structure is employed in this embodiment mode, a single-layer structure or a stacked-layer structure including three or more layers may be employed. In this embodiment mode, the insulating films 1554 and 1556 are successively formed by a plasma CVD method without being exposed to the air. Note that materials for the insulating films 1554 and 1556 are not limited to the above-described material.

The insulating films 1554 and 1556 can also be formed using a material selected from substances including silicon oxide, silicon nitride, aluminum oxide, aluminum nitride, aluminum oxynitride, aluminum nitride oxide containing more nitrogen than oxygen, aluminum oxide, diamond-like carbon (DLC), a carbon film containing nitrogen, and other substances containing an inorganic insulating material. Further, a siloxane resin may be used as well. Note that a siloxane resin is a resin containing a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. A fluoro group may be included in the organic group. Alternatively, an organic insulating material such as polyimide, acrylic, polyamide, polyimide amide, benzocyclobutene, or polysilazane can be used.

Next, contact holes (openings) that reach the single crystal semiconductor layers are formed in the insulating films 1554 and 1556 and the gate insulating layer 1508, using a mask made of a resist material. Etching may be performed once or a plurality of times depending on the selectivity of materials to be used. In this embodiment mode, first etching is performed under a condition that selectivity of the insulating film 1556 that is a silicon oxynitride film to each of the insulating film 1554 that is a silicon nitride oxide film and the gate insulating layer 1508 can be obtained; thus, the insulating film 1556 is removed. Next, the insulating film 1554 and the gate insulating layer 1508 are removed by second etching, and openings each of which reaches a source or a drain are formed.

Then, a conductive film is formed so as to cover the openings, and the conductive film is etched. Accordingly, source or drain electrode layers 1558a, 1558b, 1560a, 1560b, 1562a, and 1562b which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, and tin; a compound or an alloy material that contains any of the given elements as its main component (for example, indium tin oxide (ITO), indium zinc oxide (IZO), indium tin oxide to which silicon oxide has been added (ITSO), zinc oxide, aluminum-neodymium (Al—Nd), magnesium-silver (Mg—Ag), or the like); a material that is a combination of any of these compounds; or the like can be used. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Figure 17A:
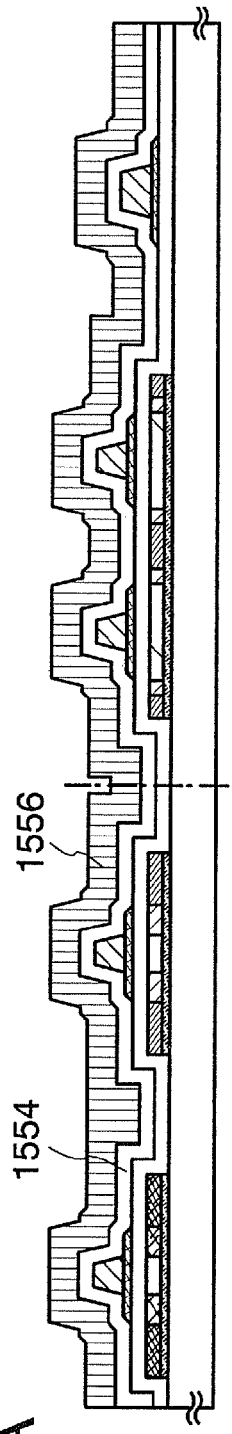
FIGS. 17A to 17C are diagrams showing a manufacturing process of a semiconductor device of the present invention.
Figure 17B:
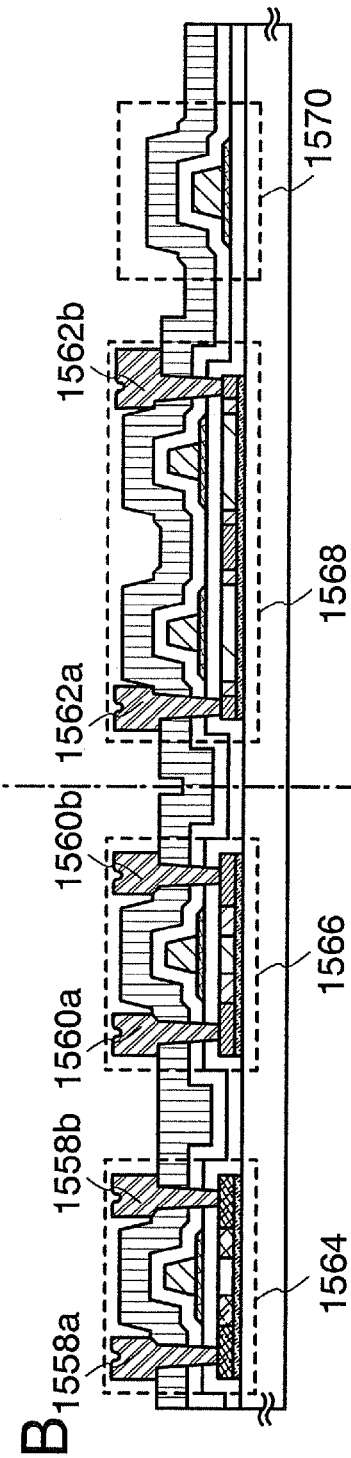

Through the above processes, a p-channel thin film transistor 1564 and an n-channel thin film transistor 1566 are formed in the peripheral driver circuit region 1580, and an n-channel thin film transistor 1568 and a capacitor wiring 1570 are formed in the pixel region 1582 (see FIG. 17B).

Next, an insulating film 1572 is formed as a second interlayer insulating layer. The insulating film 1572 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, aluminum oxide, diamond-like carbon (DLC), a carbon film containing nitrogen, phosphosilicate glass (PSG), borophosphosilicate glass (BPSG), an alumina film, polysilazane, or other substances containing an inorganic insulating material. Further, a siloxane resin may be used as well. Alternatively, an organic insulating material such as polyimide, acrylic, polyamide, polyimide amide, or benzocyclobutene can be used.

Figure 17C:
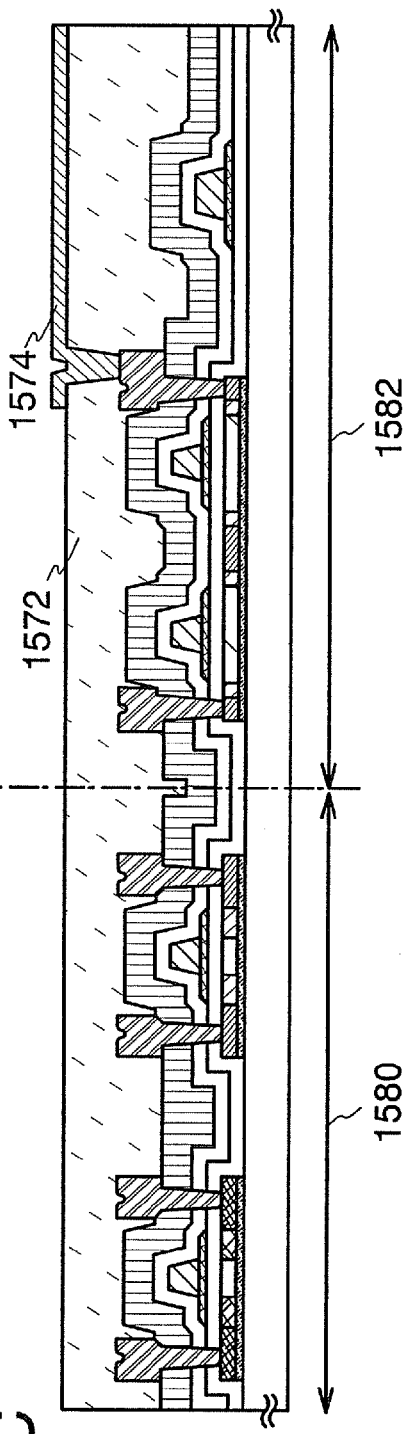

Next, a contact hole is formed in the insulating film 1572 of the pixel region 1582 to form a pixel electrode layer 1574 (see FIG. 17C). The pixel electrode layer 1574 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive high molecule (also referred to as a conductive polymer) can be used for the pixel electrode layer 1574. A thin film of a conductive composition preferably has a sheet resistance of less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive high molecule which is contained in the conductive composition is desirably less than or equal to 0.1 Ω·cm.

As the conductive high molecule, a so-called π electron conjugated conductive high molecule can be used. For example, polyaniline and a derivative thereof, polypyrrole and a derivative thereof, polythiophene and a derivative thereof, a copolymer of those materials, and the like can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above conductive high molecule may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive high molecule may be changed, whereby electrical conductivity may be adjusted.

The conductive composition as described above is dissolved in water or an organic solvent (e.g., an alcohol-based solvent, a ketone-based solvent, an ester-based solvent, a hydrocarbon-based solvent, or an aromatic-based solvent), so that a thin film which serves as the pixel electrode layer 1574 can be formed by an application method, a coating method, a droplet discharge method (also referred to as an ink-jet method), a printing method, or the like.

Figure 18A:
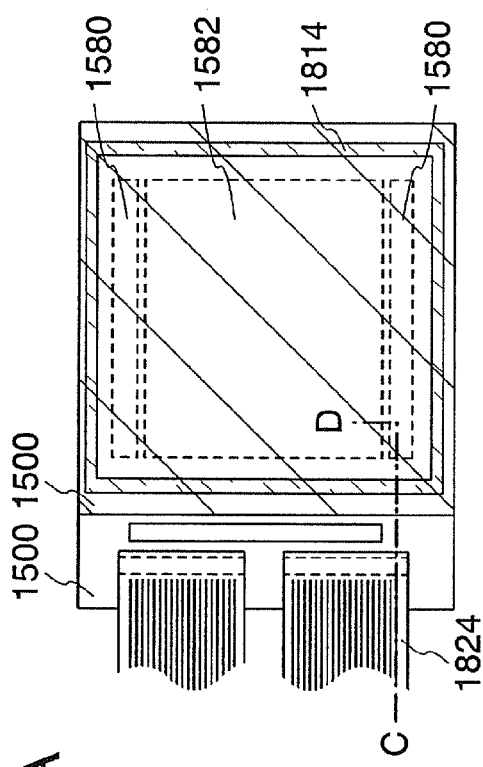
FIGS. 18A and 18B are a plan view and a cross-sectional view of a semiconductor device of the present invention, respectively.
Figure 18B:
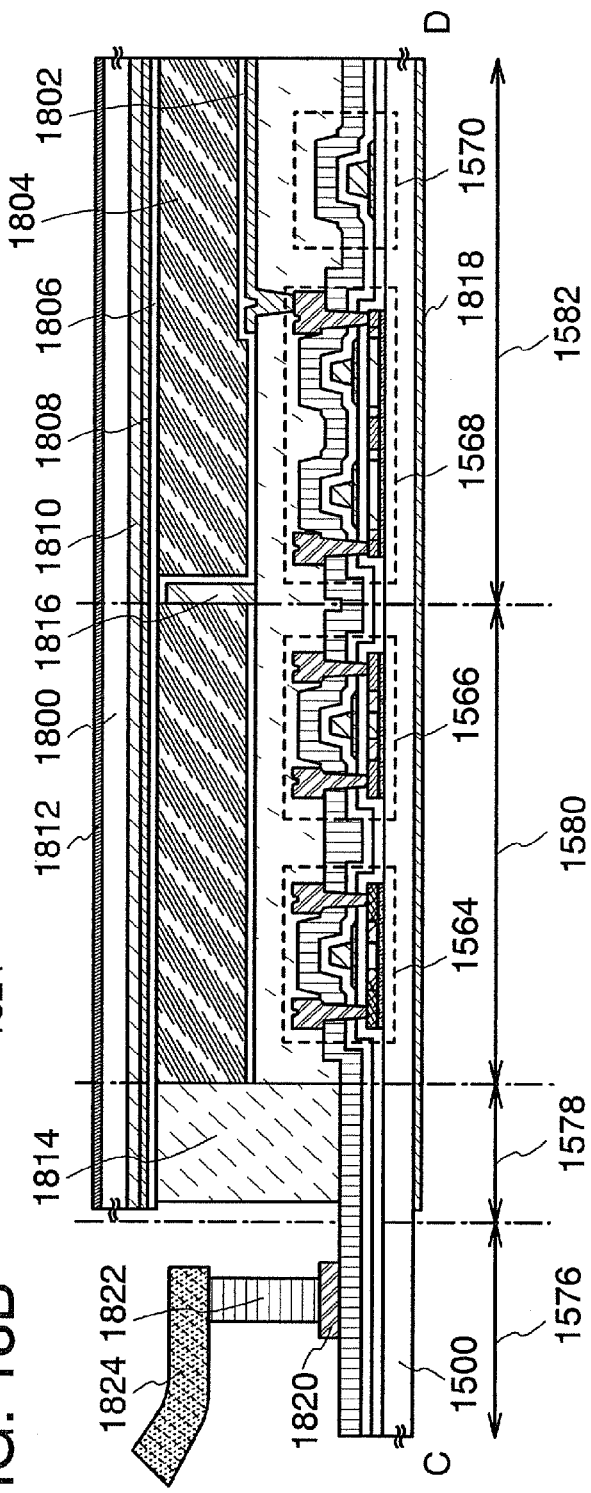

Subsequently, an insulating layer 1802 referred to as an alignment film is formed to cover the pixel electrode layer 1574 and the insulating film 1572 (see FIG. 18B). The insulating layer 1802 can be formed by a screen printing method or an offset printing method. Note that FIGS. 18A and 18B illustrate a plan view and a cross-sectional view of a semiconductor device, respectively. FIG. 18A is a plan view of a semiconductor device, and FIG. 18B is a cross-sectional view taken along line C-D of FIG. 18A. The semiconductor device includes an external terminal connection region 1576, a sealing region 1578, the peripheral driver circuit region 1580, and the pixel region 1582.

After forming the insulating layer 1802, rubbing treatment is performed. An insulating layer 1806 which serves as an alignment film can be formed in a manner similar to the insulating layer 1802.

Then, a counter substrate 1800 is attached to the substrate 1500 having the insulating surface with a sealing material 1814 and a spacer 1816 interposed therebetween, and a liquid crystal layer 1804 is provided in a gap therebetween. Note that the counter substrate 1800 is provided with the insulating layer 1806 which serves as an alignment film, a conductive layer 1808 which serves as a counter electrode, a coloring layer 1810 which serves as a color filter, a polarizer 1812 (also referred to as a polarizing plate), or the like. Note that although the substrate 1500 having the insulating surface is provided with a polarizer 1818 (a polarizing plate), the present invention is not limited thereto. For example, a polarizer may be provided on one side in a reflective type liquid crystal display device.

Subsequently, an FPC 1824 is connected to a terminal electrode layer 1820 that is electrically connected to the pixel region, with an anisotropic conductive layer 1822 interposed therebetween. The FPC 1824 has a function of transmitting a signal from the external. The liquid crystal display device can be manufactured by the above-described process.

In this embodiment mode, a liquid crystal display device is manufactured using the large-sized semiconductor substrate manufactured in Embodiment Mode 1. Therefore, liquid crystal display devices are manufactured with improved productivity. Further, by providing a base substrate in a semiconductor substrate with a depression, an impurity element which is present at a surface and the vicinity of the base substrate can be removed, and deterioration of characteristics of a liquid crystal display device can be reduced. Furthermore, by providing a base substrate with the depression, single crystal semiconductor layers can be prevented from being separated from the base substrate. That is, reliability of a liquid crystal display device can be increased.

As described above, by using the present invention, semiconductor devices can be manufactured with improved productivity, and reliability of semiconductor devices can be improved as well.

Note that a method for manufacturing a liquid crystal display device is described in this embodiment mode; however, the present invention is not limited to this. This embodiment mode can be combined with any of Embodiment Modes 1 to 3 as appropriate.

Embodiment Mode 5

This embodiment mode will describe a semiconductor device having a light-emitting element related to the present invention (an electroluminescence display device). Note that as to a method for manufacturing transistors which are used for a peripheral driver circuit, a pixel region, and the like, it is possible to refer to Embodiment Mode 4; thus, the details are omitted.

As to a semiconductor device having a light-emitting element, any one of bottom emission, top emission, and dual emission can be employed. This embodiment mode will describe a semiconductor device employing bottom emission with reference to FIGS. 19A and 19B; however, the present invention is not limited thereto.

In a semiconductor device illustrated in FIGS. 19A and 19B, light is emitted downwardly (in a direction indicated by an arrow). Here, FIG. 19A is a plan view of the semiconductor device, and FIG. 19B is a cross-sectional view taken along line E-F of FIG. 19A. In FIGS. 19A and 19B, the semiconductor device includes an external terminal connection region 1930, a sealing region 1932, a driver circuit region 1934, and a pixel region 1936.

The semiconductor device illustrated in FIGS. 19A and 19B includes an element substrate 1900, thin film transistors 1950, 1952, 1954, and 1956, a light-emitting element 1960, an insulating layer 1968, a filler 1970, a sealant 1972, a wiring layer 1974, a terminal electrode layer 1976, an anisotropic conductive layer 1978, an FPC 1980, and a sealing substrate 1990. Note that the light-emitting element 1960 includes a first electrode layer 1962, a light-emitting layer 1964, and a second electrode layer 1966.

As the first electrode layer 1962, a light-transmitting conductive material is used so that light emitted from the light-emitting layer 1964 can be transmitted. On the other hand, as the second electrode layer 1966, a conductive material which can reflect light emitted from the light-emitting layer 1964 is used.

As the first electrode layer 1962, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide to which silicon oxide is added (ITSO), or the like may also be used.

A conductive composition containing a conductive high molecule (also referred to as a conductive polymer) can also be used as the first electrode layer 1962. Note that as to the details, it is possible to refer to Embodiment Mode 4; thus, the descriptions are omitted.

As the second electrode layer 1966, a conductive film formed of titanium, tungsten, nickel, gold, platinum, silver, copper, tantalum, molybdenum, aluminum, magnesium, calcium, lithium, or an alloy thereof may be used. A substance having high reflectivity in a visible region is preferable, and an aluminum film is used in this embodiment mode.

Note that in the case of employing each of top emission and dual emission, the design of the electrode layers may be changed, as appropriate. Specifically, in the case of top emission, the first electrode layer 1962 is formed using a reflective material, and the second electrode layer 1966 is formed using a light-transmitting material. In the case of dual emission, the first electrode layer 1962 and the second electrode layer 1966 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted.

Note that even a material like metal which is generally considered to have no light-transmitting property can transmit light when it has a small thickness (approximately greater than or equal to 5 nm and less than or equal to 30 nm). Accordingly, an electrode layer which transmits light can also be formed using the above-described light-reflecting material.

The sealing substrate 1990 may be provided with a color filter (a coloring layer). The color filter (a coloring layer) can be formed by an evaporation method or a droplet discharge method. Alternatively, a color conversion layer may be used.

In this embodiment mode, an electroluminescent display device is manufactured using a large-sized semiconductor substrate manufactured in accordance with Embodiment Mode 1. Thus, electroluminescent display devices are manufactured with improved productivity. Further, by providing a base substrate in a semiconductor substrate with a depression, an impurity element which is present at a surface and the vicinity of the base substrate can be removed, and accordingly, deterioration of characteristics of an electroluminescent display device can be reduced. Furthermore, by providing a base substrate with a depression, a single crystal semiconductor layer can be prevented from being separated from the base substrate. That is, reliability of the electroluminescent display device can be improved.

As described above, by using the present invention, semiconductor devices can be manufactured with improved productivity, and reliability of semiconductor devices can be improved as well.

Note that this embodiment mode is described using an electroluminescence display device; however, the present invention is not limited thereto. This embodiment mode can be implemented by being combined with any of Embodiment Modes 1 to 4, as appropriate.

Embodiment Mode 6

Figure 20:
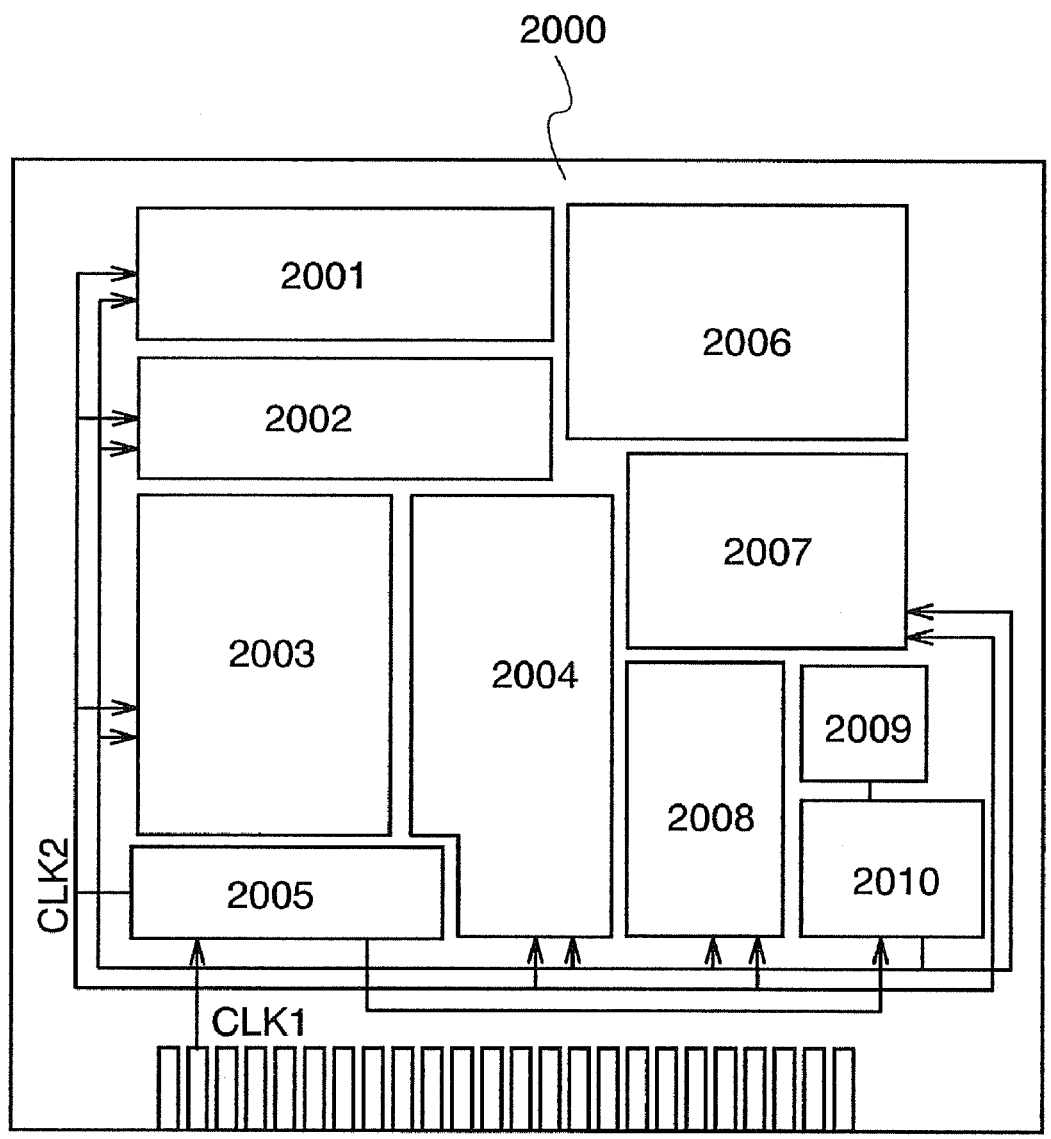
FIG. 20 is a diagram showing a structure of a semiconductor device of the present invention.
Figure 21:
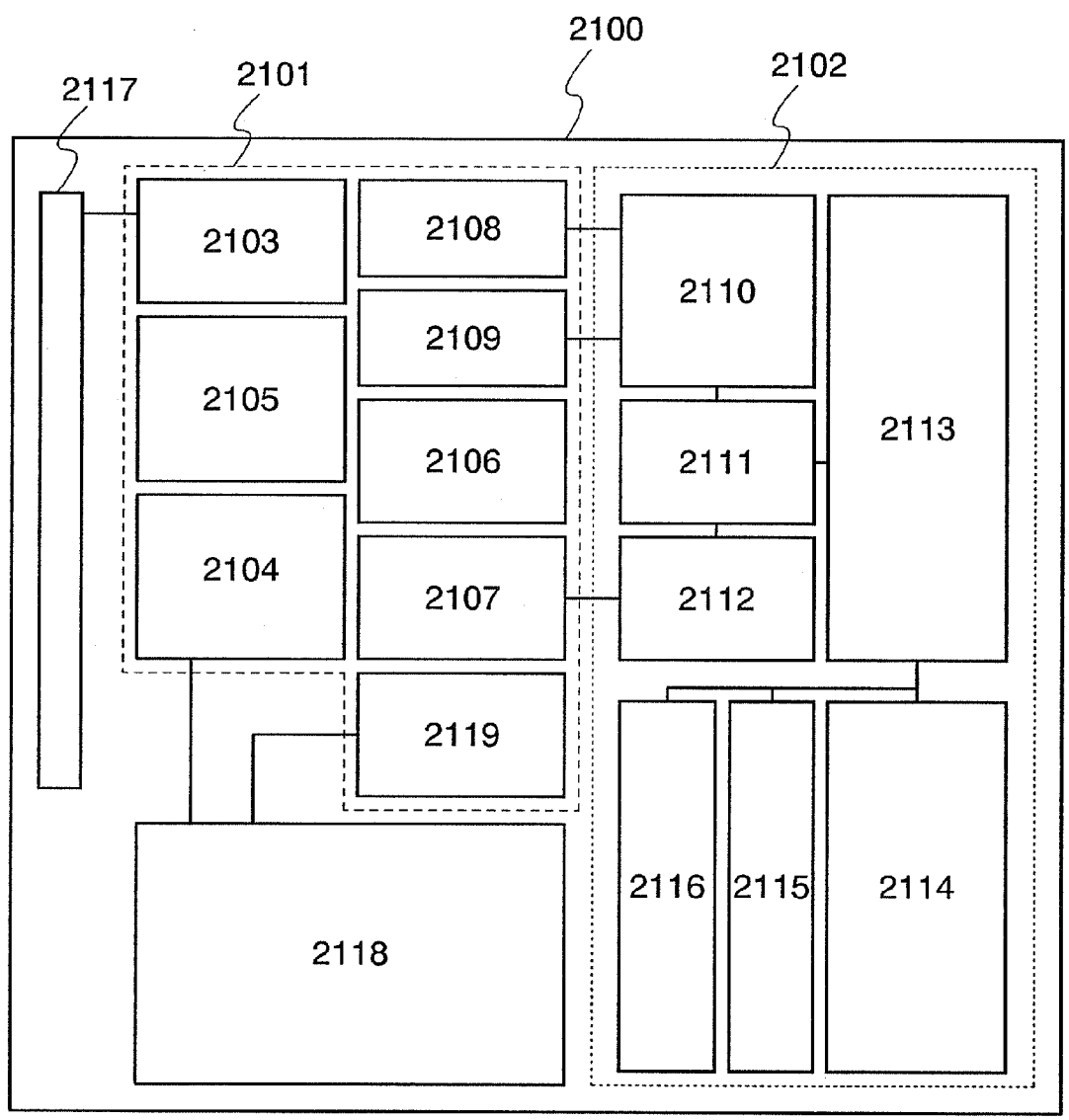
FIG. 21 is a diagram showing a structure of a semiconductor device of the present invention.

This embodiment mode will describe another example of a semiconductor device of the present invention with reference to FIGS. 20 and 21. Note that a microprocessor and an electronic tag (also referred to as a wireless tag) are given as examples in this embodiment mode; however, the semiconductor device of the present invention is not limited thereto.

FIG. 20 shows an example of a microprocessor of the present invention. A microprocessor 2000 in FIG. 20 is manufactured using the semiconductor substrate of the present invention. This microprocessor 2000 has an arithmetic logic unit (ALU) 2001, an ALU controller 2002, an instruction decoder 2003, an interrupt controller 2004, a timing controller 2005, a register 2006, a register controller 2007, a bus interface (Bus I/F) 2008, a read-only memory (ROM) 2009, and a ROM interface (ROM I/F) 2010.

An instruction input to the microprocessor 2000 through the bus interface 2008 is input to the instruction decoder 2003, decoded therein, and then input to the ALU controller 2002, the interrupt controller 2004, the register controller 2007, and the timing controller 2005. The ALU controller 2002, the interrupt controller 2004, the register controller 2007, and the timing controller 2005 conduct various controls based on the decoded instruction. In specific, the ALU controller 2002 generates signals for controlling the operation of the ALU 2001. While the microprocessor 2000 is executing a program, the interrupt controller 2004 processes an interrupt request from an external input/output device or a peripheral circuit based on its priority or the like. The register controller 2007 generates an address of the register 2006, and reads and writes data from and to the register 2006 in accordance with the state of the microprocessor 2000. The timing controller 2005 generates signals for controlling timing of operation of the ALU 2001, the ALU controller 2002, the instruction decoder 2003, the interrupt controller 2004, and the register controller 2007. For example, the timing controller 2005 is provided with an internal clock generator for generating an internal clock signal CLK2 based on a reference clock signal CLK1, and supplies the internal clock signal CLK2 to the above-mentioned various circuits. Note that the structure of the microprocessor 2000 shown in FIG. 20 is merely an example, and can be changed as appropriate depending on the uses.

The microprocessor in this embodiment mode is formed using a large-sized semiconductor substrate manufactured in accordance with Embodiment Mode 1. Thus, microprocessors are manufactured with improved productivity. Further, by providing a base substrate in a semiconductor substrate with a depression, an impurity element which is present at a surface and the vicinity of the base substrate can be removed, and accordingly, deterioration of characteristics of a microprocessor can be reduced. Furthermore, by providing a base substrate with a depression, a single crystal semiconductor layer can be prevented from being separated from the base substrate. That is, reliability of the microprocessor can be improved.

As described above, by using the present invention, microprocessors can be manufactured with improved productivity, and reliability of microprocessors can be improved as well.

Next, an example of a semiconductor device having an arithmetic function and capable of contactless data transmission and reception is described with reference to FIG. 21. FIG. 21 illustrates an example of a wireless tag which transmits and receives signals to/from an external device by wireless communication. Note that the wireless tag of the present invention includes a central processing unit (CPU), so to speak, a miniaturized computer. A wireless tag 2100 has an analog circuit portion 2101 and a digital circuit portion 2102. The analog circuit portion 2101 has a resonance circuit 2103 with a resonance capacitor, a rectifier circuit 2104, a constant voltage circuit 2105, a reset circuit 2106, an oscillator circuit 2107, a demodulator circuit 2108, a modulator circuit 2109, and a power management circuit 2119. The digital circuit portion 2102 has an RF interface 2110, a control register 2111, a clock controller 2112, a CPU interface 2113, a CPU 2114, a RAM 2115, and a ROM 2116.

The operation of the wireless tag 2100 having such a structure is described below. When an antenna 2117 receives a signal from outside, an induced electromotive force is generated in the resonance circuit 2103 based on the signal. A capacitor portion 2118 is charged with the induced electromotive force which has passed through the rectifier circuit 2104. This capacitor portion 2118 is preferably formed using a capacitor such as a ceramic capacitor or an electric double layer capacitor. The capacitor portion 2118 may be formed over the same substrate as the wireless tag 2100 or may be attached as another component to a substrate having an insulating surface that partially constitutes the wireless tag 2100.

The reset circuit 2106 generates a signal for resetting and initializing the digital circuit portion 2102. For example, a signal that rises after an increase in power supply voltage is generated as the reset signal. The oscillator circuit 2107 changes the frequency and duty ratio of a clock signal in response to a control signal generated by the constant voltage circuit 2105. The demodulator circuit 2108 having a low pass filter binarizes changes in amplitude of an amplitude-modulated (ASK) reception signals, for example. The modulator circuit 2109 varies the amplitude of an amplitude-modulated (ASK) transmission signal and transmits the signal. The modulator circuit 2109 varies the resonance point of the resonance circuit 2103, thereby varying the amplitude of communication signals. The clock controller 2112 generates a control signal for changing the frequency and duty ratio of a clock signal in accordance with the power supply voltage or a consumption current of the CPU 2114. The power supply voltage is monitored by the power management circuit 2119.

A signal that is input to the wireless tag 2100 from the antenna 2117 is demodulated by the demodulator circuit 2108, and then divided into a control command, data, and the like by the RF interface 2110. The control command is stored in the control register 2111. The control command includes a reading instruction of data stored in the ROM 2116, a writing instruction of data to the RAM 2115, an arithmetic instruction to CPU 2114, and the like. The CPU 2114 accesses the ROM 2116, the RAM 2115, and the control register 2111 via the CPU interface 2113. The CPU interface 2113 has a function to generate an access signal for any one of the ROM 2116, the RAM 2115, and the control register 2111 based on an address requested by the CPU 2114.

As an arithmetic method of the CPU 2114, a method may be employed in which the ROM 2116 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of process and the CPU conducts the other part of the arithmetic process by using a program.

The wireless tag in this embodiment mode is formed using a large-sized semiconductor substrate manufactured in accordance with Embodiment Mode 1. Thus, wireless tags are manufactured with improved productivity. Further, by providing a base substrate in a semiconductor substrate with a depression, an impurity element which is present at a surface and the vicinity of the base substrate can be removed, and accordingly, deterioration of characteristics of a wireless tag can be reduced. Furthermore, by providing a base substrate with a depression, a single crystal semiconductor layer can be prevented from being separated from the base substrate. That is, reliability of the wireless tag can be improved.

As described above, by using the present invention, wireless tags can be manufactured with improved productivity, and reliability of wireless tags can be improved as well.

Note that this embodiment mode can be implemented by being combined with any of Embodiment Modes 1 to 5, as appropriate.

Embodiment Mode 7

This embodiment mode describes an electronic device using a semiconductor device of the present invention, particularly using a display device, with reference to FIGS. 22A to 22H.

As electronic devices manufactured using the semiconductor device of the present invention, the following can be given: a video camera, a digital camera, a goggle type display (a head mounted display), a navigation system, an audio reproducing device (car audio set, or the like), a computer, a game machine, a portable information terminal (mobile computer, a cellular phone, a portable game machine, an e-book reader, or the like), and an image reproducing device provided with a recording medium (specifically, a device provided with a display that can reproduce a recording medium such as a digital versatile disc (DVD) and display the image), and the like.

Figure 22A:
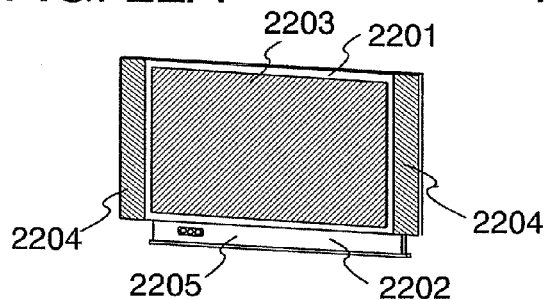
FIGS. 22A to 22H are diagrams showing electronic devices using semiconductor devices of the present invention.

FIG. 22A illustrates a television set or a monitor of a personal computer. The television set or monitor of a personal computer includes a housing 2201, a support stand 2202, a display portion 2203, speaker portions 2204, video input terminals 2205, and the like. The semiconductor device of the present invention is used for the display portion 2203. According to the present invention, highly reliable television sets or highly reliable monitors of personal computers can be provided with high productivity (in other words, at low cost).

Figure 22B:
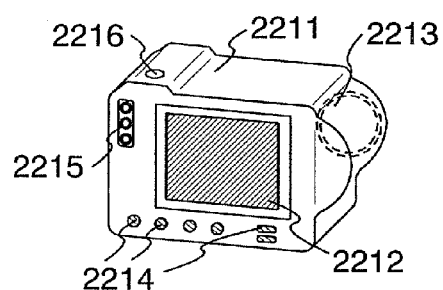

FIG. 22B illustrates a digital camera. On the front side part of a main body 2211, an image receiver 2213 is provided, and on the top side part of the main body 2211, a shutter button 2216 is provided. Furthermore, on the back side part of the main body 2211, a display portion 2212, operation keys 2214, and an external connection port 2215 are provided. The semiconductor device of the present invention is used for the display portion 2212. According to the present invention, highly reliable digital cameras can be provided with high productivity (in other words, at low cost).

Figure 22C:
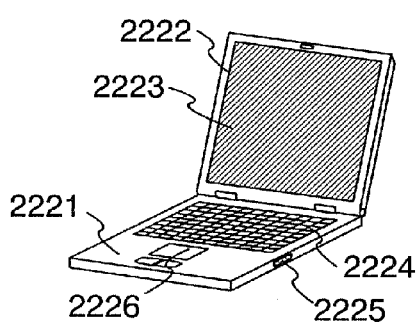

FIG. 22C illustrates a notebook personal computer. In a main body 2221, a keyboard 2224, an external connection port 2225, and a pointing device 2226 are provided. Furthermore, a housing 2222 that has a display portion 2223 is attached to the main body 2221. The semiconductor device of the present invention is used for the display portion 2223. According to the present invention, highly reliable notebook personal computers can be provided with high productivity (in other words, at low cost).

Figure 22D:
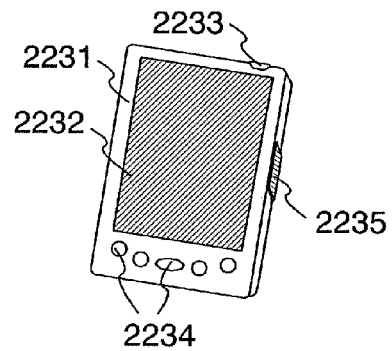

FIG. 22D illustrates a mobile computer that includes a main body 2231, a display portion 2232, a switch 2233, operation keys 2234, an infrared port 2235, and the like. Furthermore, an active matrix display device is provided in the display portion 2232. The semiconductor device of the present invention is used for the display portion 2232. According to the present invention, highly reliable mobile computers can be provided with high productivity (in other words, at low cost).

Figure 22E:
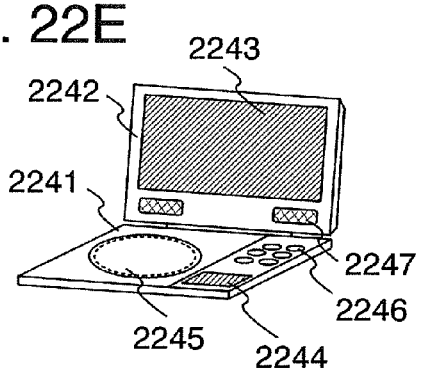

FIG. 22E illustrates an image reproducing device. In a main body 2241, a display portion 2244, a storage media reader 2245, and operation keys 2246 are provided. Furthermore, a housing 2242 that has speaker portions 2247 and a display portion 2243 is attached to the main body 2241. The semiconductor device of the present invention is used for each of the display portion 2243 and the display portion 2244.

According to the present invention, highly reliable image reproducing devices can be provided with high productivity (in other words, at low cost).

Figure 22F:
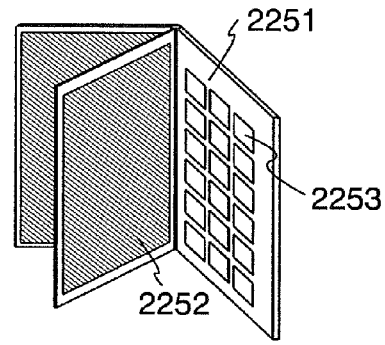

FIG. 22F illustrates an electronic book reader. In a main body 2251, operation keys 2253 are provided. Furthermore, a plurality of display portions 2252 is attached to the main body 2251. The semiconductor device of the present invention is used for the display portion 2252. According to the present invention, highly reliable electronic book readers can be provided with high productivity (in other words, at low cost).

Figure 22G:
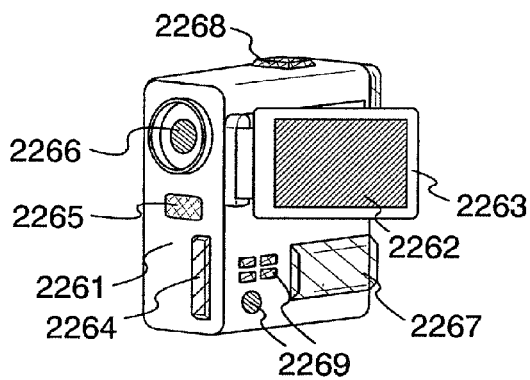

FIG. 22G illustrates a video camera. In a main body 2261, an external connection port 2264, a remote control receiver 2265, an image receiver 2266, a battery 2267, an audio input portion 2268, operation keys 2269 are provided. Furthermore, a housing 2263 that has a display portion 2262 is attached to the main body 2261. The semiconductor device of the present invention is used for the display portion 2262. According to the present invention, highly reliable video cameras can be provided with high productivity (in other words, at low cost).

Figure 22H:
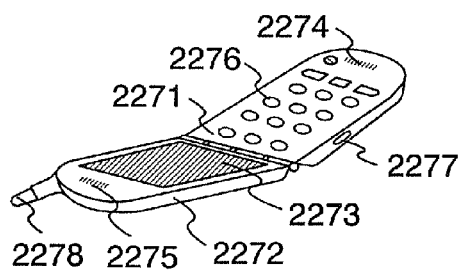
Figure 23A:
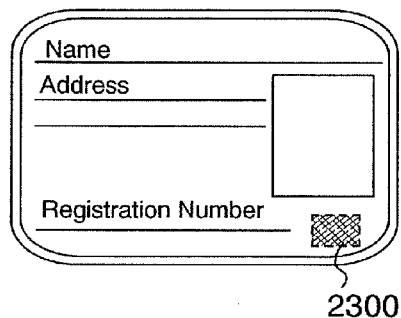
FIGS. 23A to 23F are diagrams showing uses of semiconductor devices of the present invention.
Figure 23B:
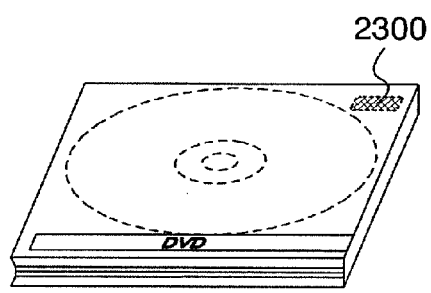
Figure 23C:
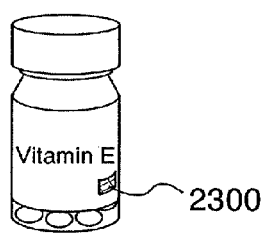
Figure 23D:
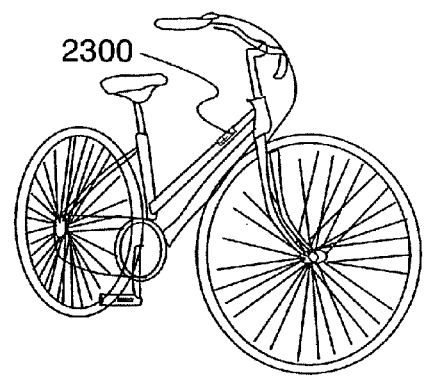
Figure 23E:
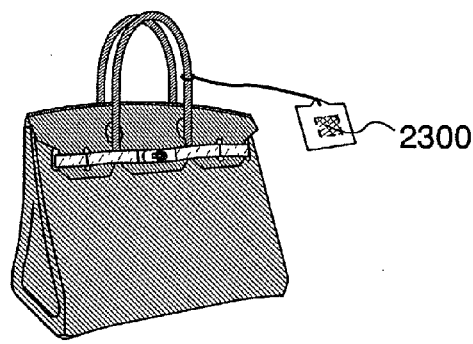
Figure 23F:
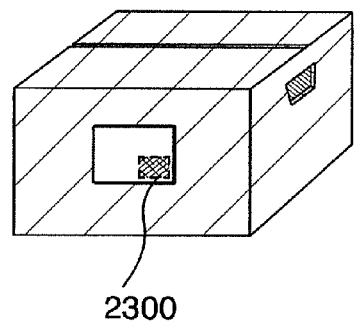

FIG. 22H illustrates a cellular phone that includes a main body 2271, a housing 2272, a display portion 2273, an audio input portion 2274, an audio output portion 2275, operation keys 2276, an external connection port 2277, an antenna 2278, and the like. The semiconductor device of the present invention is used for the display portion 2273. According to the present invention, highly reliable cellular phones can be provided with high productivity (in other words, at low cost).

As described above, the present invention can be widely applied to and used in electronic devices in various fields. Note that this embodiment mode can be implemented by being combined with any of Embodiment Modes 1 to 6, as appropriate.

Embodiment Mode 8

This embodiment mode describes applications of a semiconductor device, in particular, a wireless tag (also referred to as a RFID tag) of the present invention with reference to FIGS. 23A to 23F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 23A), containers for wrapping objects (wrapping paper, bottles, and the like, see FIG. 23C), recording media (DVD software, video tapes, and the like, see FIG. 23B), vehicles (bicycles and the like, see FIG. 23D), personal belongings (bags, glasses, and the like), foods, plants, clothes, lifestyle goods, and products such as electronic devices, or shipping tags of baggage (see FIGS. 23E and 23F). Note that the wireless tag is indicated by reference numeral 2300 in each of FIGS. 23A to 23F.

Note that the electronic device indicates a liquid crystal display device, an EL display device, a television unit (also simply referred to as a TV, a TV receiver, or a television receiver), a cellular phone, and the objects shown in Embodiment Mode 5, for example. The semiconductor device may also be mounted on animals, human body, and the like.

The wireless tag is attached to a surface of an object, or embedded to be fixed on an object. For example, the RFID tag may be embedded in paper of a book, or an organic resin of a container for wrapping an object to be fixed on each object. Counterfeits can be prevented by providing an RFID tag on the bills, coins, securities, bearer bonds, certificates, and the like. Further, by providing an RFID tag in containers for wrapping objects, recording media, personal belongings, foods, clothes, lifestyle goods, electronic devices, and the like, inspection systems, rental systems and the like can be performed more efficiently. The wireless tag that can be formed according to the present invention has high reliability though it is inexpensive, and can be applied to various objects.

When a wireless tag that can be formed according to the present invention is applied to a management system or a distribution system of articles, the system can have high functionality. For example, information which is recorded in an RFID tag provided in a tag is read by a reader/writer provided near a conveyor belt, then information about a distribution process, a delivery destination, or the like is read out, and inspection of merchandise or distribution of goods can be easily carried out.

As described, the present invention can be widely applied to and used in various objects. Note that this embodiment mode can be implemented by being combined with any of Embodiment Modes 1 to 7, as appropriate.

This application is based on Japanese Patent Application serial no. 2007-264719 filed with Japan Patent Office on Oct. 10, 2007, the entire contents of which are hereby incorporated by reference.

What is claimed is:

1. A method for manufacturing a semiconductor device including a semiconductor substrate comprising the steps of:
   arranging a plurality of single crystal semiconductor substrates in a tray;
   forming an insulating layer over the plurality of single crystal semiconductor substrates;
   forming a damaged region in each of the plurality of single crystal semiconductor substrates by irradiating the plurality of single crystal semiconductor substrates with ions;
   forming a bonding layer over the insulating layer;
   bonding each of the plurality of single crystal semiconductor substrates and a substrate having an insulating surface with the bonding layer interposed therebetween;
   separating the plurality of single crystal semiconductor substrates with a plurality of single crystal semiconductor layers left over the substrate having an insulating surface; and
   forming a depression in the substrate having an insulating surface, wherein the depression is formed between one of the plurality of single crystal semiconductor layers and another adjacent one of the plurality of single crystal semiconductor layers.

2. The method for manufacturing a semiconductor device according to claim 1, wherein a distance between one of the plurality of single crystal semiconductor layers and another adjacent one of the plurality of single crystal semiconductor layers is less than or equal to 0.5 mm.

3. The method for manufacturing a semiconductor device according to claim 1, wherein a depth of the depression is more than or equal to 2 nm and less than or equal to 20 nm.

4. The method for manufacturing a semiconductor device according to claim 1, wherein the bonding layer includes a silicon oxide film.

5. The method for manufacturing a semiconductor device according to claim 1, wherein the insulating layer includes at least one of a silicon oxide film, a silicon nitride film, a silicon oxynitride film, and a silicon nitride oxide film.

6. The method for manufacturing a semiconductor device according to claim 1, wherein the tray includes quartz glass or stainless steel.

7. A method for manufacturing a semiconductor device including a semiconductor substrate comprising the steps of:

arranging a plurality of single crystal semiconductor substrates in a tray;

forming an insulating layer over the plurality of single crystal semiconductor substrates;

forming a damaged region in each of the plurality of single crystal semiconductor substrates by irradiating the plurality of single crystal semiconductor substrates with ions;

forming a bonding layer over the insulating layer;

bonding each of the plurality of single crystal semiconductor substrates and a substrate having an insulating surface with the bonding layer interposed therebetween;

separating the plurality of single crystal semiconductor substrates with a plurality of single crystal semiconductor layers left over the substrate having an insulating surface;

forming a depression in the substrate having an insulating surface, wherein the depression is formed between one of the plurality of single crystal semiconductor layers and another adjacent one of the plurality of single crystal semiconductor layers, and removing a surface of each of the plurality of single crystal semiconductor layers.

8. The method for manufacturing a semiconductor device according to claim 7, wherein a distance between one of the plurality of single crystal semiconductor layers and another adjacent one of the plurality of single crystal semiconductor layers is less than or equal to 0.5 mm.

9. The method for manufacturing a semiconductor device according to claim 7, wherein a depth of the depression is more than or equal to 2 nm and less than or equal to 20 nm.

10. The method for manufacturing a semiconductor device according to claim 7, wherein the bonding layer includes a silicon oxide film.

11. The method for manufacturing a semiconductor device according to claim 7, wherein the insulating layer includes at least one of a silicon oxide film, a silicon nitride film, a silicon oxynitride film, and a silicon nitride oxide film.

12. The method for manufacturing a semiconductor device according to claim 7, wherein the tray includes quartz glass or stainless steel.

* * * * *